United States Patent

Satou

(10) Patent No.: US 9,166,494 B2
(45) Date of Patent: Oct. 20, 2015

(54) POWER CONVERTER

(75) Inventor: Toshiaki Satou, Shiga (JP)

(73) Assignee: DAIKIN INDUSTRIES, LTD., Osaka-Shi (JP)

(\*) Notice: Subject to any disclaimer, the term of this patent is extended or adjusted under 35 U.S.C. 154(b) by 632 days.

(21) Appl. No.: 13/516,978

(22) PCT Filed: Dec. 15, 2010

(86) PCT No.: PCT/JP2010/072545
§ 371 (c)(1),
(2), (4) Date: Jun. 18, 2012

(87) PCT Pub. No.: WO2011/086804
PCT Pub. Date: Jul. 21, 2011

(65) Prior Publication Data
US 2012/0257425 A1  Oct. 11, 2012

(30) Foreign Application Priority Data
Jan. 18, 2010 (JP) ................. 2010-008026

(51) Int. Cl.
*H02M 5/458* (2006.01)
*H02M 1/08* (2006.01)
*H03K 17/687* (2006.01)

(52) U.S. Cl.
CPC ............ *H02M 5/4585* (2013.01); *H02M 1/08* (2013.01); *H03K 17/6871* (2013.01); *H03K 2217/009* (2013.01); *H03K 2217/0081* (2013.01)

(58) Field of Classification Search
CPC ........... H02M 5/40; H02M 5/42; H02M 5/44; H02M 5/45; H02M 5/453; H02M 5/458; H02M 5/4585; H02M 1/08; H02M 1/088; H02M 7/219; H03K 2217/0081; H03K 2217/0009
USPC .............. 323/271, 285–285, 351; 363/15–17, 363/34–37, 40–41, 52–55, 56.01–56.05, 84, 363/89, 95–98, 108–109, 125, 127, 363/131–132, 135–136; 326/82–92
See application file for complete search history.

(56) References Cited

U.S. PATENT DOCUMENTS 5,218,523 A \* 6/1993 Sugishima .................... 363/132
5,280,228 A \* 1/1994 Kanouda et al. .............. 318/803
(Continued)

FOREIGN PATENT DOCUMENTS

| JP | 7-250485 A | 9/1995 |
| JP | 2004-153889 A | 5/2004 |

(Continued)

*Primary Examiner* — Timothy J Dole
*Assistant Examiner* — Ivan Laboy Andino
(74) *Attorney, Agent, or Firm* — Birch, Stewart, Kolasch & Birch, LLP

(57) ABSTRACT

A power supplying section is an operation power supply for a switching element for an inverter, and one end on a low potential side is connected to one end of the switching element on a DC power supply line side. A boot capacitor is connected to one end of the switching element on a DC power supply line side, where the other end is electrically connected to one end of the power supply section on the high potential side. A diode is provided in a path extending from one end of the power supply section on the high potential side to the DC power supply line via the boot capacitor. The diode makes only the current, which is flowing from the power supply section to the boot capacitor, flow.

16 Claims, 16 Drawing Sheets

(56) References Cited

U.S. PATENT DOCUMENTS

| | | | |
|---|---|---|---|
| 5,706,189 A * | 1/1998 | Majumdar et al. | 363/95 |
| 5,969,964 A * | 10/1999 | Mangtani | 363/132 |
| 6,256,215 B1 * | 7/2001 | Barrett et al. | 363/132 |
| 6,522,098 B1 | 2/2003 | Majumdar et al. | |
| 7,215,189 B2 * | 5/2007 | Wilhelm | 327/589 |
| 2008/0013351 A1 * | 1/2008 | Alexander | 363/123 |
| 2008/0258808 A1 * | 10/2008 | Locatelli et al. | 327/589 |
| 2009/0086515 A1 | 4/2009 | Sakakibara | |
| 2009/0195068 A1 * | 8/2009 | Ohashi et al. | 307/18 |
| 2012/0250375 A1 * | 10/2012 | Satou | 363/37 |

FOREIGN PATENT DOCUMENTS

| | | |
|---|---|---|
| JP | 2007-295686 A | 11/2007 |
| JP | 4158715 B2 | 10/2008 |

* cited by examiner

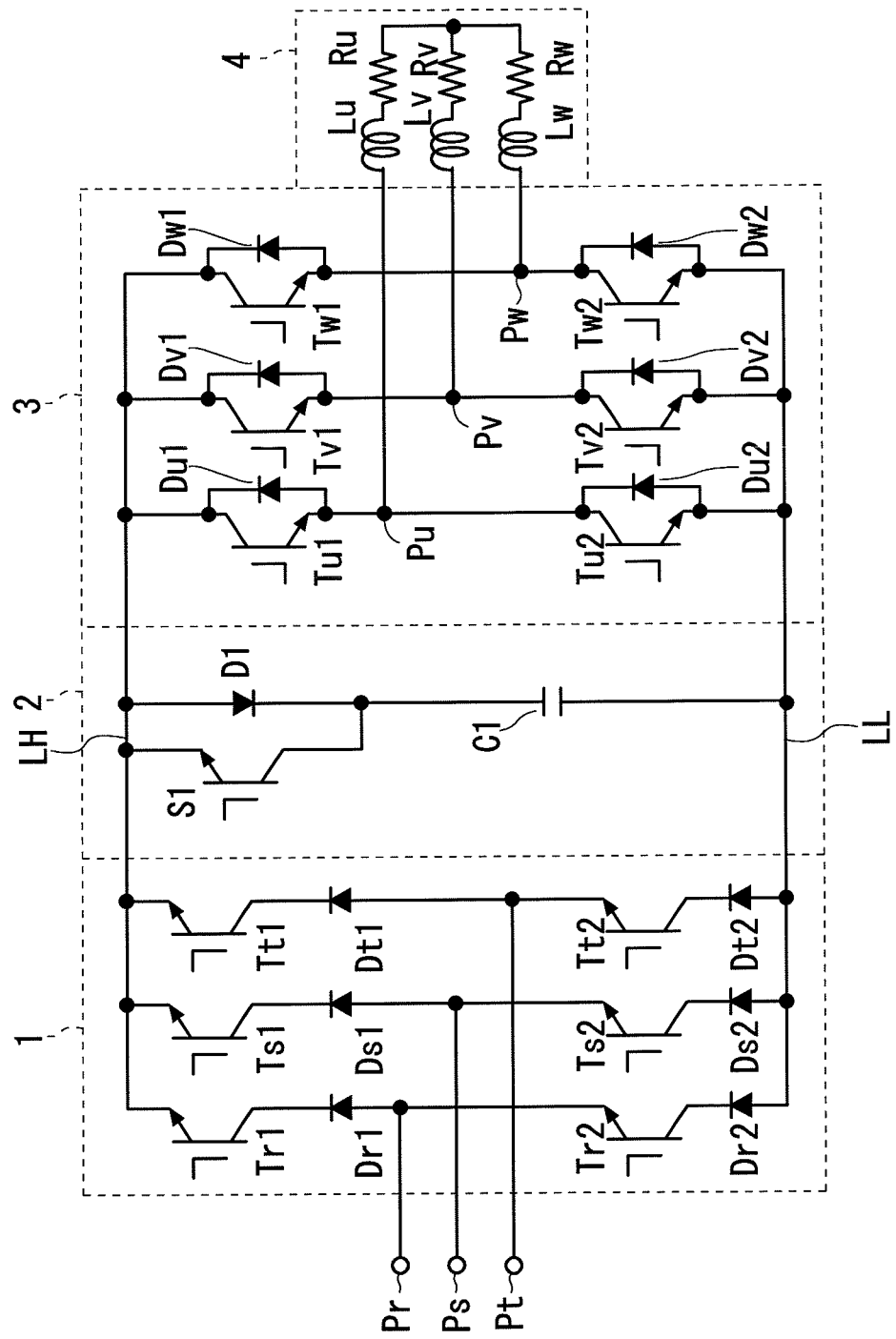
F I G . 1

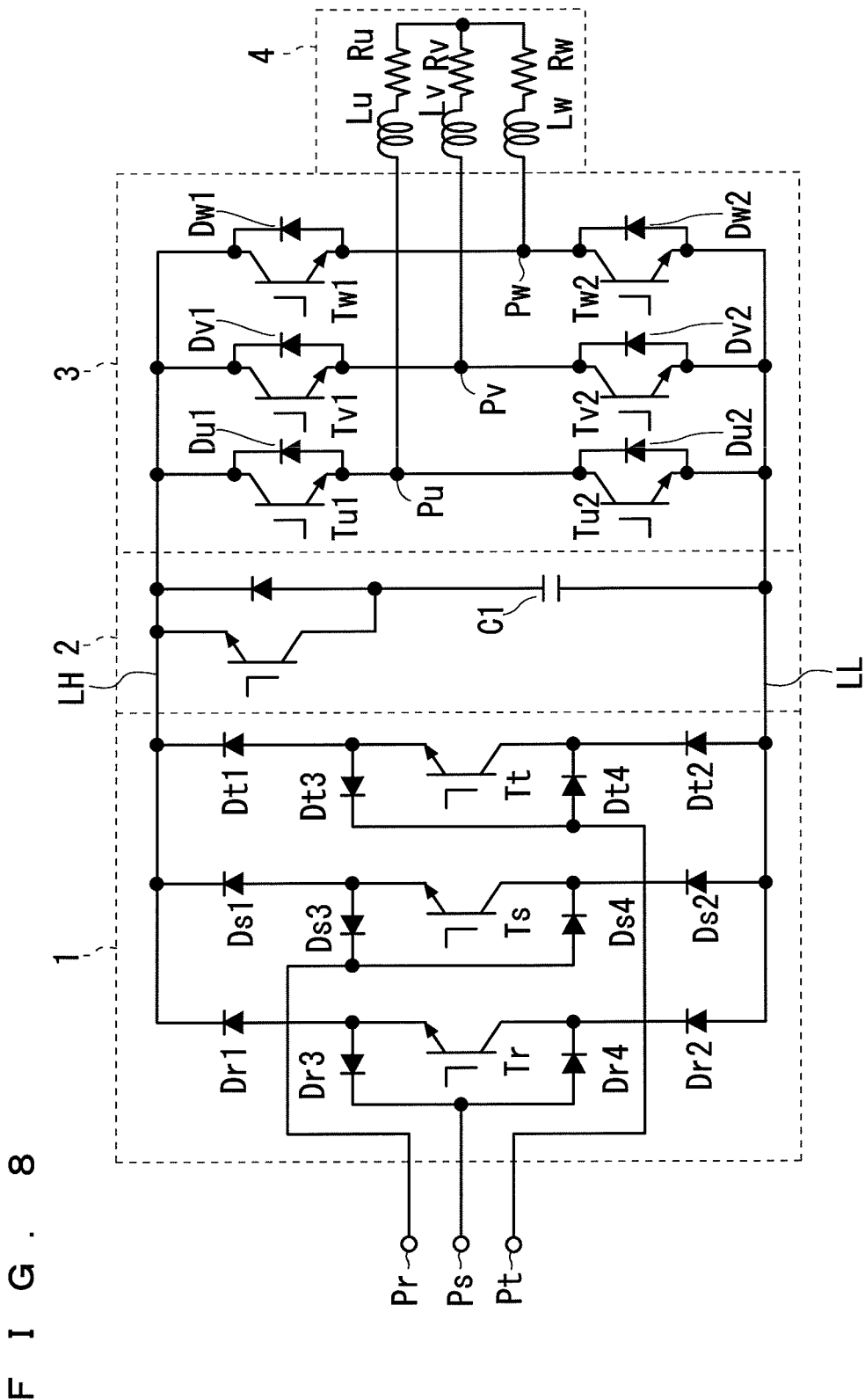
F I G . 8

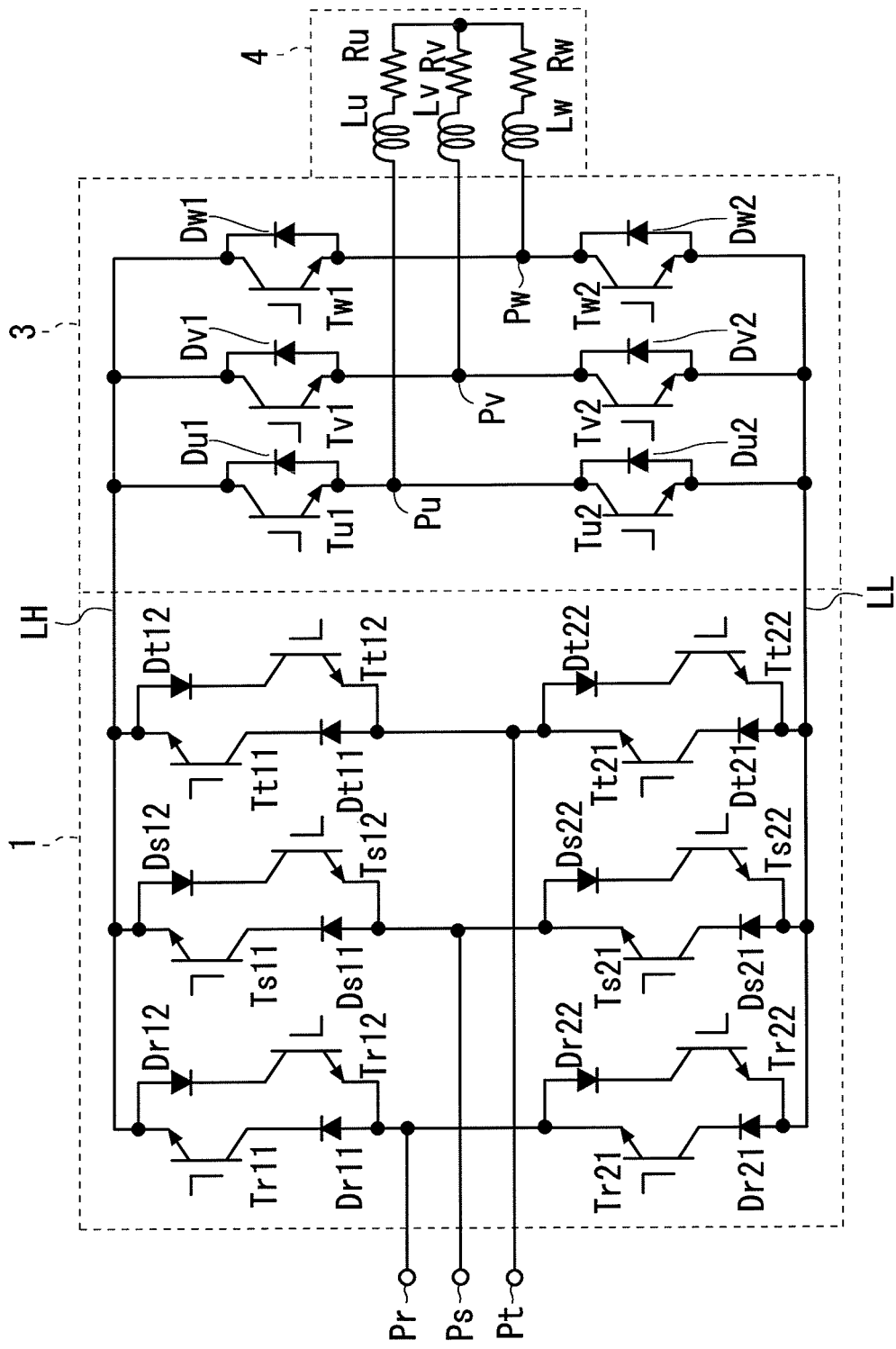
F I G . 1 4

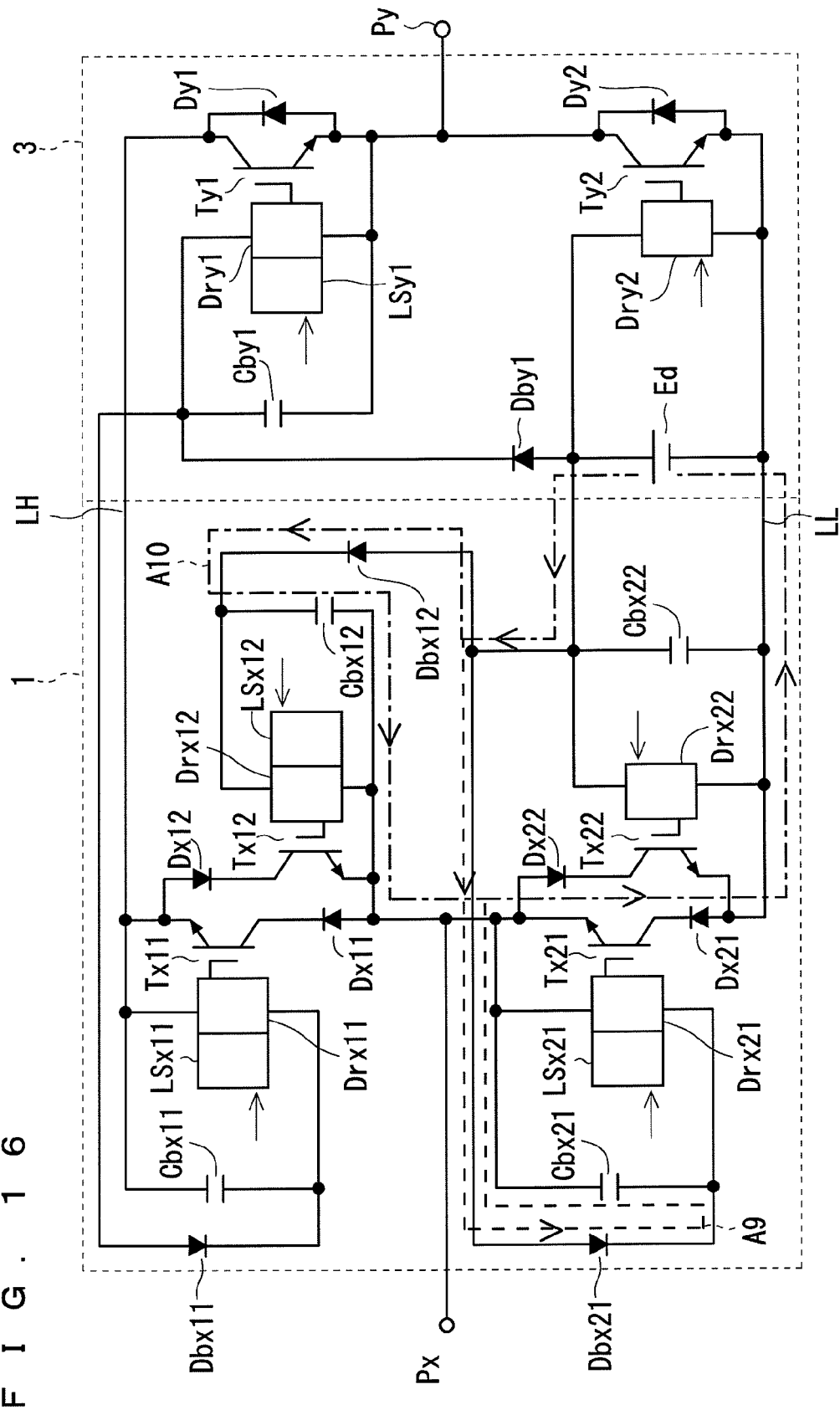

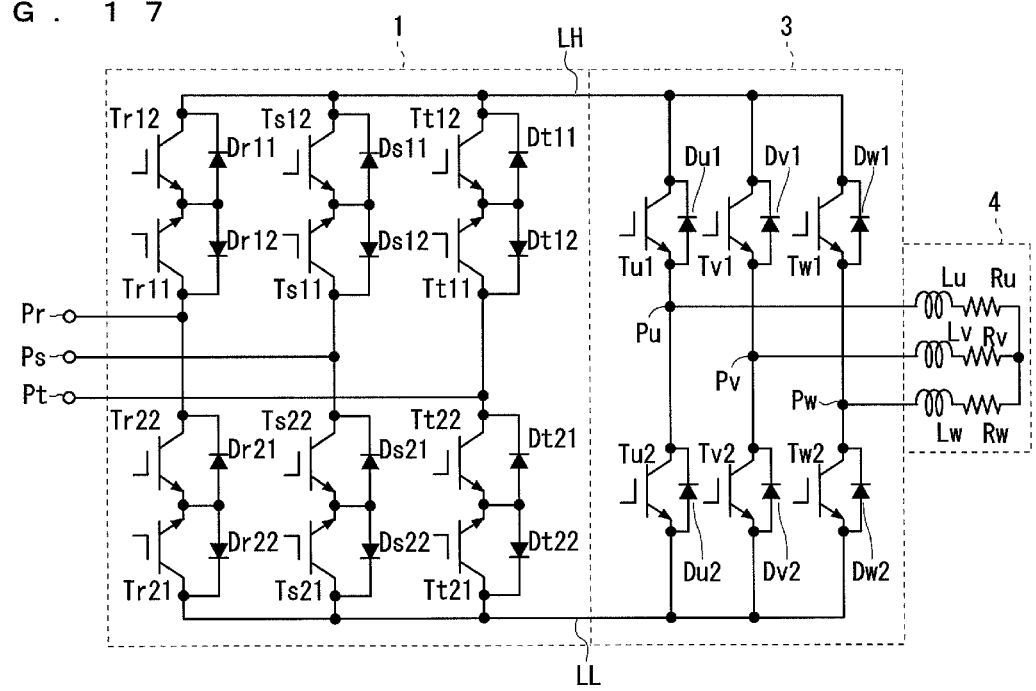
F I G . 1 7

POWER CONVERTER

TECHNICAL FIELD

The present invention relates to power converters, and in particular, to an operation power supply for outputting the switch signal to a switching element.

BACKGROUND ART

Japanese Patent Application Laid-Open No. 7-250485 describes an inverter. The inverter includes an upper side switching element and a lower side switching element connected in series to each other between two direct current (DC) power supply lines. A first internal control circuit for providing a switch signal is connected to the upper side switching element, and a second internal control circuit for providing a switch signal is connected to the lower side switching element.

The DC power supply is supplied to the second internal control circuit as the operation power supply. A voltage between both ends of a capacitor is supplied to the first internal control circuit as the operation power supply. A diode is connected between one end on a high potential side of the capacitor and one end on a high potential side of the DC power supply. The diode is arranged with an anode directed towards the DC power supply.

According to such configuration, the capacitor is charged with the DC power supply as a power supply by conduction of the lower side switching element.

Techniques related to the present invention are also disclosed in Japanese Patent No. 4158715 and Japanese Patent Application Laid-Open No. 2007-295686.

SUMMARY OF THE INVENTION

PROBLEMS TO BE SOLVED BY THE INVENTION

In Japanese Patent Application Laid-Open No. 7-250485, however, the operation power supply of the switching element other than the switching element of the inverter is not considered.

The present invention provides a power converter capable of obtaining an operation power supply of a switching element other than an inverter from an operation power supply of the switching element of the inverter.

Means for Solving the Problems

A first aspect of a power converter according to the present invention includes a first power supply line (LH); a second power supply line (LL) applied with a potential lower than that of the first power supply line; an output end (Py); and a power converting section including a first switching element (Ty1) arranged between the output end and the first power supply line, and a power supply section (Cby1) having both ends between which a DC voltage is supported, one end on a low potential side of the ends being connected to the first switching element on the second power supply line side and serving as an operation power supply for outputting a switch signal to the first switching element; a second switching element (Tx1, Tx2, S1) arranged between the first and second power supply lines; a boot capacitor (Cbx1, Cbx2, Cb1, Cbx) including one end connected to the second switching element on the first power supply line side and another end electrically connected to the other end of the power supply section, and serving as an operation power supply for outputting a switch signal to the second switching element when charged; and a diode (Dbx1, Dbx2, Db1, Dbx), arranged between the other end of the power supply section and the first power supply line through the boot capacitor, for flowing current only in a direction from the power supply section towards the boot capacitor.

A second aspect of the power converter according to the present invention relates to the power converter according to the first aspect and further includes a third switching element (Tx2) connected in series with the second switching element (Tx1) on the second power supply line side between the first and the second power supply lines (LH, LL); a second boot capacitor (Cbx2) including one end connected to the third switching element on the first power supply line side and another end, and serving as an operation power supply for outputting a switch signal to the third switching element when charged; and a second diode (Dbx2) arranged with a cathode directed towards the second boot capacitor between the other end of the boot capacitor (Cbx1) or the other end of the power supply section (Cby1) and the other end of the second boot capacitor.

A third aspect of the power converter according to the present invention relates to the power converter according to the first or second aspect, wherein the second switching element has a reverse blocking structure.

A fourth aspect of the power converter according to the present invention relates to the power converter according to the first aspect and further includes a second diode (Dx1) connected in series with the second switching element (Tx1) on the second power supply line (LL) side and arranged with an anode directed towards the second power supply line; a third switching element (Tx2) connected in series on the second power supply line side with respect to a serial body of the second switching element and the second diode; a third diode (Dx2) connected in series with the third switching element on the second power supply line side with respect to the serial body; and a second boot capacitor (Cbx2) including one end connected to the third switching element on the first power supply line side and another end connected to the other end of the boot capacitor, and serving as an operation power supply for outputting a switch signal to the third switching element when charged.

A fifth aspect of the power converter according to the present invention relates to the power converter according to the fourth aspect, wherein the third diode (Dx2) is positioned on the second power supply line (LL) side with respect to the third switching element (Tx2).

A sixth aspect of the power converter according to the present invention relates to the power converter according to the first aspect, wherein the diode (Dx1) is arranged between the second switching element (Tx) and the first power supply line (LH).

A seventh aspect of the power converter according to the present invention relates to the power converter according to the first aspect and further includes a second diode (Dx1) arranged between the first power supply line and a connecting point of the second switching element (Tx1) and the boot capacitor (Cbx1), wherein the diode (Dbx1) is arranged between the power supply section (Cby1) and the connecting point.

An eighth aspect of the power converter according to the present invention relates to the power converter according to the first aspect and further includes a second diode (Dx11) connected in series with the second switching element (Tx11) and arranged with a cathode directed towards the first power supply line (LH); a third switching element (Tx12); a third diode (Dx12) connected in series with the third switching element and arranged with a cathode directed towards the second power supply line (LL), a serial body of the third diode and the third switching element being connected in parallel with a serial body of the second switching element and the second diode; a second boot capacitor (Cbx12) including one end connected to the third switching element on the second power supply line side and another end connected to the other end of the boot capacitor (Cbx11) and serving as an operation power supply for outputting a switch signal to the third switching element when charged; and a fourth diode (Dbx12) arranged with a cathode directed towards the second boot capacitor between the boot capacitor and the second boot capacitor.

A ninth aspect of the power converter according to the present invention relates to the power converter according to the first aspect and further includes a second diode (Dx11) connected in series with the second switching element (Tx11) and arranged with a cathode directed towards the first power supply line; a third switching element (Tx12); a third diode (Dx12) connected in series with the third switching element and arranged with a cathode directed towards the second power supply line, a serial body of the third diode and the third switching element being connected in parallel with a serial body of the second switching element and the second diode; a bidirectional switching element (Tx21, Tx22, Dx21, Dx22) connected in series with the serial body on the second power supply line side; a fourth switching element (Ty2) arranged between the output end and the second power supply line; a second power supply section (Ed) having one end connected to the fourth switching element (Ty2) on the second power supply line side and serving as an operation power supply for outputting a switch signal to the fourth switching element; a second boot capacitor (Cbx12) including one end connected to the third switching element on the second power supply line side and another end connected to another end of the second power supply section and serving as an operation power supply for outputting a switch signal to the third switching element when charged; and a fourth diode (Dbx12) arranged with a cathode directed towards the second boot capacitor between the second boot capacitor and the second power supply section.

A tenth aspect of the power converter according to the present invention relates to the power converter according to the first aspect, and further includes a third switching element (Tx12) connecting to the second switching element (Tx11) on the first power supply line (LH) side, a second diode (Dx11) connected in parallel to the third switching element with a cathode directed towards the first power supply line, and a third diode (Dx12) connected in parallel with the second switching element with a cathode directed towards the second power supply line (LL); wherein the boot capacitor is commonly connected to a connecting point of the second switching element and the third switching element, and functions as an operation power supply for outputting a switch signal to the second switching element and the third switching element.

An eleventh aspect of the power converter according to the present invention relates to the power converter according to any one of the first to fifth, eighth, and ninth aspects, wherein the second switching element (Tr1, Ts1, Tt1) is arranged in plurals, all of the second switching elements are directly connected to the first power supply line (LH), and the boot capacitor (Cbx1) functions as an operation power supply for outputting a switch signal to two or more second switching elements of the plurality of second switching elements.

A twelfth aspect of the power converter according to the present invention relates to the power converter according to any one of the first to eleventh aspects, wherein the power converting section further includes a voltage adjustment unit (VAy1) for lowering voltage of the voltage supplying section (Cby1) to function as an operation power supply of the first switching element (Ty1).

A thirteenth aspect of the power converter according to the present invention relates to the power converter according to any one of the first to twelfth aspects, wherein the first switching element (Tu1, Tv1, Tw1) and the power supply section (Cbu1, Cbv1, Cbw1) are arranged in plurals, one end of the plurality of power supply sections respectively being connected to the plurality of first switching elements on the second power supply line (LL) side; the diode (Dbx11) is arranged between other end of one of the plurality of power supply sections (Cbu1) and other end of the boot capacitor (Cbx1); and a boot diode (Dbx12) arranged with a cathode directed towards the boot capacitor between other end of another one of the plurality of power supply sections (Cbv1) and other end of the boot capacitor is further arranged.

A fourteenth aspect of the power converter according to the present invention relates to the power converter according to any one of the first to twelfth aspects, wherein the first switching element (Tu1, Tv1, Tw1) and the power supply section (Cu1, Cv1, Cw1) are arranged in plurals, one end of the plurality of power supply sections being connected to the plurality of first switching elements on the second power supply line (LL) side, and the diode (Dx1) is arranged between the second switching element (Tx1) and the first power supply line (LH).

A fifteenth aspect of the power converter according to the present invention relates to the power converter according to any one of the first to fourteenth aspects, wherein the power supply section is a third boot capacitor (Cby1), and a fourth switching element (Ty2) arranged between the output end and the second power supply line; a DC power supply (Ed) having one end connected to the fourth switching element on the second power supply line side and another end, and serving as an operation power supply for outputting a switch signal to the fourth switching element, and a diode (Dby1) arranged with an anode directed towards the DC power supply and a cathode directed towards the third boot capacitor between the other end of the boot capacitor and the other end of the DC power supply are further arranged.

Effect of the Invention

According to the first and seventh aspects of the power converter of the present invention, one end of the power supply section substantially becomes the potential of the first power supply source, and the potential of the other end of the power supply section substantially becomes the sum of the first power supply line and the DC voltage of the power supply section by conducting the first switching element. The boot capacitor is thereby charged with the power supply section as the power supply.

Therefore, the operation power supply of the third switching element can be obtained from the operation power supply of the first switching element.

Furthermore, the current flows from the current supply section to the boot capacitor when only the first switching element is conducted during the normal operation, and hence the voltage lowering of the boot capacitor can be suppressed. A capacitor having a small electrostatic capacitance thus can be used as the boot capacitor.

According to the second aspect of the power converter of the present invention, the third and fourth switching elements can be used as configuring elements of the current type converter.

According to the third aspect of the power converter of the present invention, the voltage drop in the reverse blocking diode of when conducting the third switching element and charging the second boot capacitor can be avoided compared to when connecting the reverse blocking diode in series with the third switching element.

According to the fourth aspect of the power converter of the present invention, the second and third diodes can respectively exhibit the reverse blocking ability on the third and fourth switching elements. Thus, the third and fourth switching elements, and the second and third diodes can be caused to function as the configuring elements of the current type converter.

Moreover, the current flows from the boot capacitor to the second boot capacitor through the second diode and the third switching element by conducting the third switching element, thus charging the second boot capacitor.

The second diode inhibits the second boot capacitor from discharging through the path. Therefore, the discharging of the second boot capacitor can be prevented while having the second diode exhibit the reverse blocking ability as the current type converter. Thus, the manufacturing cost can be reduced compared to when the individual diode is arranged.

According to the fifth aspect of the power converter of the present invention, the voltage between both ends of the second boot capacitor can be increased since the third diode is not interposed in the charging path of the second boot capacitor.

According to the sixth aspect of the power converter of the present invention, the diode exhibits the reverse blocking ability as the third switching element. The diode and the third switching element thus can be caused to function as the configuring element of the current type converter. The diode also inhibits the boot capacitor from discharging towards the power supply section.

Therefore, the discharging of the boot capacitor can be prevented while having the diode exhibit the reverse blocking ability as the current type converter. Thus, the manufacturing cost can be reduced compared to when the individual diode is arranged.

According to the eighth aspect of the power converter of the present invention, the second and third switching elements and the second and third diodes configure the bidirectional switching element. According to such configuration, the second boot capacitor can be charged by conducting the second switching element. The manufacturing cost can be reduced since the boot capacitor and the second boot capacitor are respectively adopted for the operation power supply of the second and third switching elements.

According to the ninth aspect of the power converter of the present invention, the second and third switching elements and the second and third diodes configure the bidirectional switching element. According to such configuration, the second boot capacitor can be charged by conducting the bidirectional switching element. The manufacturing cost can be reduced since the boot capacitor and the second boot capacitor are respectively adopted for the operation power supply of the second and third switching elements.

According to the tenth aspect of the power converter of the present invention, the second and third switching elements and the second and third diodes configure the bidirectional switching element. According to such configuration, the manufacturing cost can be reduced compared to when the boot capacitor is arranged in each since it functions as the operation power supply of the second and third switching elements.

According to the eleventh aspect of the power converter of the present invention, the first power supply line functions as the common potential line of the plurality of third switching elements, and thus the variation in the potential of the operation voltage can be reduced among the plurality of third switching elements even if one boot capacitor functions as the operation power supply of the plurality of third switching elements.

According to the twelfth aspect of the power converter of the present invention, the voltage between both ends of the boot capacitor is lower than the voltage of the power supply section since the boot capacitor is charged from the power supply section through the diode and the first switching element. Therefore, the voltage adjustment unit drops the voltage of the power supply section, so that the difference between the operation power supply of the first switching element and the operation power supply of the third switching element can be reduced.

According to the thirteenth and fourteenth aspects of the power converter of the present invention, the voltage between both ends of the boot capacitor can be stabilized in the normal operation.

According to the fifteenth aspect of the power converter of the present invention, the manufacturing cost can be reduced compared to when adopting the DC power supply since the boot capacitor is adopted as the operation power supply for outputting the switch signal to the first switching element.

The objects, characteristics, aspects and advantages of the present invention will become apparent by reference to the following description and the accompanying drawings.

BRIEF DESCRIPTION OF THE DRAWINGS

FIGS. 1 and 2 are views each showing one example of a conceptual configuration of a power converter;

FIG. 8 is a view showing another example of a conceptual configuration of a power converter; and FIGS. 9 to 19 are views each showing another example of a conceptual configuration of the converter and the inverter.

EMBODIMENT FOR CARRYING OUT THE INVENTION

First Embodiment

<One Example of Power Converter>

Figure 2:
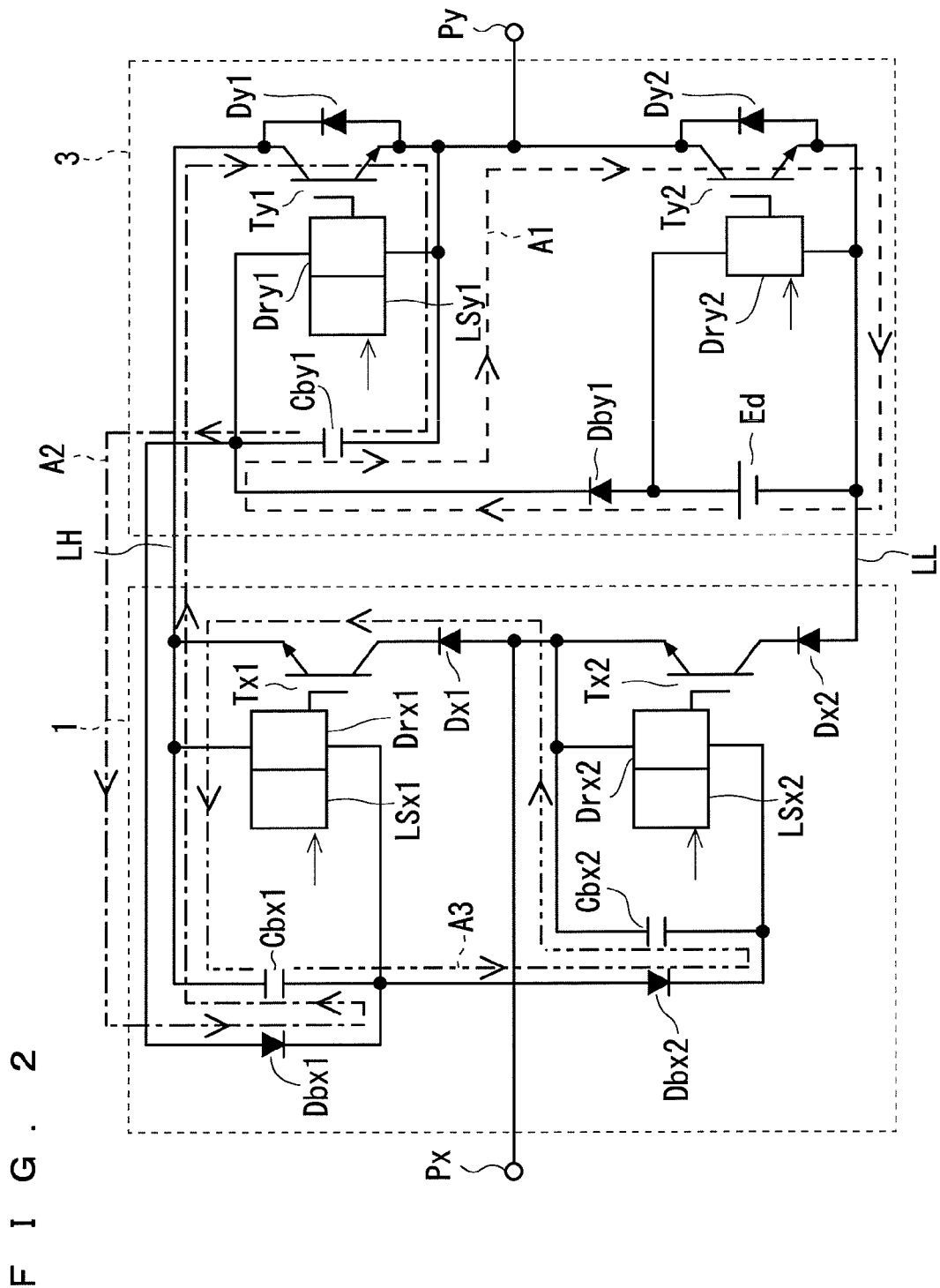

As illustrated in FIG. 1, a power converter includes a converter 1, a clamp circuit 2, and an inverter 3, which are a power converting section serving as a configuring element.

Input ends Pr, Ps, Pt are connected to the converter 1. The converter 1 converts a three-phase alternating current (AC) voltage applied to the input ends Pr, Ps, Pt to a DC voltage, and applies the same to DC power supply lines LH, LL. Describing a more specific configuration, the converter 1 has switching legs for three phases, the r, s, and t phases. The switching leg of the r phase includes switching elements Tr1, Tr2, and diodes Dr1, Dr2. The switching leg of the s phase includes switching elements Ts1, Ts2, and diodes Ds1, Ds2.

The switching leg of the t phase includes switching elements Tt1, Tt2, and diodes Dt1, Dt2. The three switching legs are connected in parallel to each other between the DC power supply lines LH, LL.

The switching elements Tx1, Tx2 (x represents r, s, t) are, for example, an insulated gate bipolar transistor. The switching elements Tx1, Tx2 include first to third electrodes. The switching elements Tx1, Tx2 make the current flowing between the first electrode and the second electrode conductive/non-conductive. A switch signal (voltage signal and current signal) for controlling conduction/non-conduction of the switching elements Tx1, Tx2 is applied to the third electrode. The first electrode also functions as a control reference electrode, which becomes a reference of the switch signal (e.g., reference potential in the case of voltage signal). In the insulated gate bipolar transistor, the first to third electrodes are respectively an emitter electrode, a collector electrode, and a gate electrode. This aspect also applies to the other switching elements to be described later.

The switching element Tx1 and the diode Dx1 are connected in series to each other between the DC power supply line LH and the input end Px. The switching element Tx1 is arranged with the emitter electrode directed towards the DC power supply line LH, and the diode Dx1 is arranged with the anode directed towards the input end Px. The switching element Tx2 and the diode Dx2 are connected in series to each other between the DC power supply line LL and the input end Px. The switching element Tx2 is arranged with the emitter electrode directed towards the input end Px, and the diode Dx2 is arranged with the anode directed towards the DC power supply line LL.

The switch signal is provided to the switching elements Tx1, Tx2, and the converter 1 converts the three phase AC voltage to the DC voltage. A potential higher than the DC power supply line LL is thus applied to the DC power supply line LH. The diodes Dx1, Dx2 exhibit a reverse blocking ability of a converter. In other words, the converter 1 functions as a current type inverter.

The inverter 3 converts the DC voltage between the DC power supply lines LH, LL to the AC voltage, and applies the same to a load 4 (e.g., motor). In the illustration of FIG. 1, the load 4 is drawn as an inductive load including a serial body of a resistor and a reactor.

The inverter 3 includes switching legs for the three phases, the u, v, w phases. The switching leg of the u phase includes switching elements Tu1, Tu2, and diodes Du1, Du2. The switching leg of the v phase includes switching elements Tv1, Tv2, and diodes Dv1, Dv2. The switching leg of the w phase includes switching elements Tw1, Tw2, and diodes Dw1, Dw2. The three switching legs are connected in parallel to each other between the DC power supply lines LH, LL.

The switching elements Ty1, Ty2 (y represent u, v, w) are, for example, an insulated gate bipolar transistor. The switching elements Ty1, Ty2 are connected in series to each other between the DC power supply lines LH, LL. The switching elements Ty1, Ty2 are both arranged with the emitter electrode directed towards the DC power supply line LL. The diodes Dy1, Dy2 are respectively connected in parallel to the switching elements Ty1, Ty2. The diodes Dy1, Dy2 are both arranged with the anode directed towards the DC power supply line LL.

An output end Py arranged between the switching elements Ty1, Ty2 is connected to the load 4.

The switch signal is provided to the switching elements Ty1, Ty2, and the inverter 3 converts the DC voltage to the AC voltage. The diodes Dy1, Dy2 respectively prevent the reverse current from flowing to the switching elements Ty1, Ty2, and also prevent the reverse voltage from being applied to the switching elements Ty1, Ty2.

The clamp circuit 2 includes a switching element S1, a diode D1, and a capacitor C1. The diode D1 and the capacitor C1 are connected in series to each other between the DC power supply lines LH, LL. The diode D1 is arranged with the anode directed towards the DC power supply line LH. The switching element S1 is an insulated gate bipolar transistor, for example, and is connected in parallel to the diode D1. The switching element S1 is arranged with the emitter electrode directed towards the DC power supply line LH.

According to the clamp circuit 2, a regenerative energy from the inverter 3 can be absorbed by the capacitor C1. The clamp circuit 2 also has an effect of a snubber circuit for absorbing the voltage rise between the DC power supply lines LH, LL by the switching.

According to the rectifying function of the diode D1, a voltage of the capacitor C1 is clamped to a maximum value of the voltage between the DC power supply lines LH, LL, where the voltage is not supplied from the capacitor C1 to the inverter 3 if the switching element S1 is non-conductive. The snubber/clamp circuit 2 thus can be equivalently ignored if the capacitor C1 is charged and the switching element S1 is non-conductive. The converter 1 and the inverter 3 can function as a direct power converter that does not include power accumulating means such as a smoothing capacitor on the DC power supply lines LH, LL. When the switch signal is provided to the switching element S1 thus causing the switching element S1 to be conductive, the DC voltage can be supplied from the capacitor C1 to the inverter 3. The regenerative energy thus can be effectively used. As the capacitor C1 merely needs to have the function of absorbing the regenerative energy, the capacitor C1 does not require the electrostatic capacitance of the so-called smoothing capacitor, and a small capacitor can be adopted.

If the load 4 is not the inductive load, the clamp circuit 2 is not an essential requirement, but is desirably provided as an inductance exists in the wiring in the actual power converter.

<Operation Power Supply of Switching Element of Converter 1 and Inverter 3>

The operation power supply for outputting the switch signal to the switching elements Tx1, Tx2, Ty1 and Ty2 will now be described with reference to FIG. 2. In the illustration of FIG. 2, only one switching leg of the converter 1 and one switching leg of the inverter 3 are representatively illustrated. The operation power supply of the snubber/clamp circuit 2 will be described later.

The converter 1 includes drive circuits Drx1, Drx2 for driving the switching elements Tx1, Tx2, respectively, and the inverter 3 includes drive circuits Dry1, Dry2 for driving the switching elements Ty1, Ty2, respectively. The drive circuits Drx1, Drx2, Dry1, and Dry2 are respectively connected to gate electrodes of the switching elements Tx1, Tx2, Ty1, and Ty2.

In the illustration of FIG. 2, the operation power supply is supplied from a DC power supply Ed to the drive circuit Dry2. One end on a low potential side of the DC power supply Ed is connected to the emitter electrode of the switching element Ty2, and the drive circuit Dry2. One end on a high potential side of the DC power supply Ed is connected to the drive circuit Dry2.

In the illustration of FIG. 2, a voltage between both ends of a boot capacitor Cby1 is supplied to the drive circuit Dry1 as the operation power supply. One end of the boot capacitor Cby1 is connected to the emitter electrode of the switching element Ty1 and the drive circuit Dry1. The other end of the boot capacitor Cby1 is connected to the drive circuit Dry1.

This content can be understood as the boot capacitor Cby1 supporting the DC voltage between the one end and the other end, and functioning as the operation power supply for outputting the switch signal to the switching element Ty1. This content also applies to other boot capacitors.

The other end of the boot capacitor Cby1 is connected to one end on the high potential side of the DC power supply Ed by way of a diode Dby1. The diode Dby1 is arranged with the anode directed towards the DC power supply Ed. The diode Dby1 prevents the boot capacitor Cby1 from discharging towards the DC power supply Ed.

A level shift circuit LSy1 is connected to the drive circuit Dry1 on the side opposite to the switching element Ty1. The level shift circuit LSy1, for example, appropriately shifts a potential level of the switch signal generated by a common control circuit (not shown) in accordance with the potential of the drive circuit Dry1, and provides the same to the drive circuit Dry1. The level shift circuits connected to the other drive circuits, to be described later, are similar, and thus the detailed description will be omitted below.

The boot capacitor Cby1 is charged prior to a normal operation of the present power converter. Specifically, the boot capacitor Cby1 is charged by conducting the switching element Ty2. This is because the current flows to a serial circuit A1 including the DC power supply Ed, the diode Dby1, the boot capacitor Cby1, and the switching element Ty2 by the conduction of the switching element Ty2.

Therefore, the boot capacitor Cby1 is adopted without adopting the DC power supply as the operation power supply of the drive circuit Dry1, and hence the manufacturing cost can be reduced.

A voltage between both ends of a boot capacitor Cbx1 is supplied to the drive circuit Drx1 as the operation power supply. One end of the boot capacitor Cbx1 is connected to the emitter electrode of the switching element Tx1 and the drive circuit Drx1. The other end of the boot capacitor Cbx1 is connected to the drive circuit Drx1, and one end on the high potential side of the boot capacitor Cby1 by way of a diode Dbx1. The diode Dbx1 is arranged with the anode directed towards the boot capacitor Cby1. The diode Dbx1 prevents the boot capacitor Cbx1 from discharging towards the boot capacitor Cby1.

In the illustration of FIG. 2, a level shift circuit LSx1 is connected to the drive circuit Drx1.

The boot capacitor Cbx1 is also charged prior to a normal operation of the power converter. Specifically, the boot capacitor Cbx1 can be charged using the charges accumulated in the boot capacitor Cby1 by conducting the switching element Ty1. This is because the current flows to a serial circuit A2 including the boot capacitor Cby1, the diode Dbx1, the boot capacitor Cbx1, and the switching element Ty1 by the conduction of the switching element Ty1.

The charging of the boot capacitor Cbx1 is executed after the charging of the boot capacitor Cby1 when the boot capacitor Cby1 is adopted as the operation power supply of the switching element Ty1, as illustrated in FIG. 2. The operation power supply cannot be supplied to the switching element Ty1 (more specifically, drive circuit Dry1) before the charging of the boot capacitor Cby1, and the switching element Ty1 cannot be made conductive. This aspect is similar in other boot capacitors to be described later.

Therefore, the boot capacitor Cbx1 is charged to function as the operation power supply for outputting the switch signal to the switching element Tx1. Therefore, the DC power supply does not need to be provided for the switching element Tx1, and the manufacturing cost can be reduced.

Furthermore, the boot capacitor Cbx1 is charged with the boot capacitor Cby1 for the switching element Ty1 arranged on the upper side of the inverter 3 as a power supply. The following effects thus can be obtained compared to when the boot capacitor Cbx1 is charged with the DC power supply Ed for the switching element Ty2 arranged on the lower side of the inverter 3 as a power supply.

Figure 3:
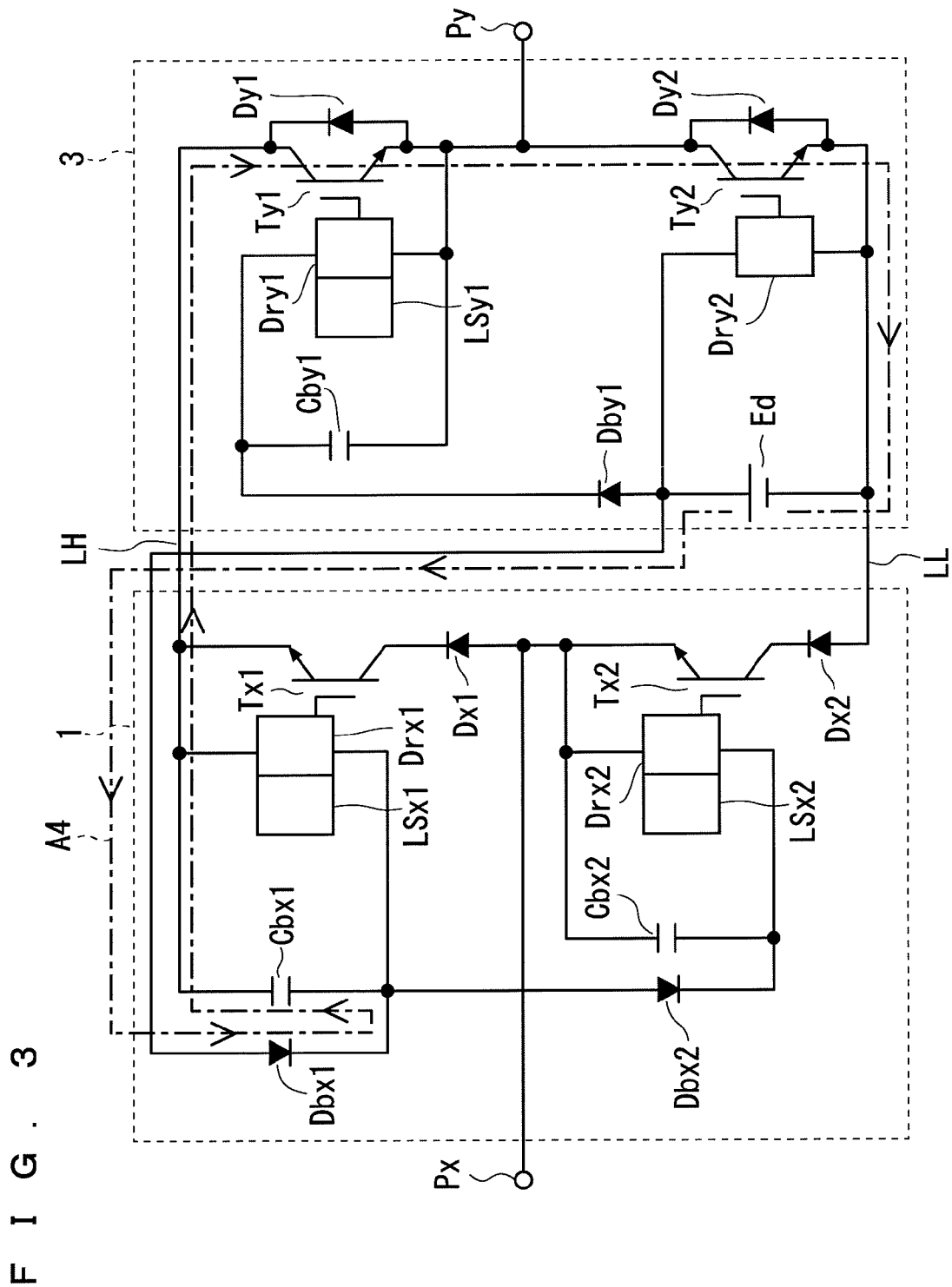
FIGS. 3 and 4 are views each showing another example of a conceptual configuration of the converter and the inverter.

If the boot capacitor Cbx1 is charged with the DC power supply Ed as a power supply, the diode Dbx1 is connected between one end on the high potential side of the DC power supply Ed and the high potential end of the boot capacitor Cbx1, as illustrated in FIG. 3. In other words, the anode of the diode Dbx1 may be connected to the anode of the diode Dby1 and the DC power supply Ed.

In this case, however, the switching elements Ty1, Ty2 need to be conducted simultaneously to charge the boot capacitor Cbx1. This is because according to such conduction, the current flows to a serial circuit A4 including the DC power supply Ed, the diode Dbx1, the boot capacitor Cbx1, and the switching elements Ty1, Ty2, thus charging the boot capacitor Cbx1.

However, in the normal operation of the inverter 3, the switching elements Ty1, Ty2 are exclusively conducted with each other, and are not simultaneously conducted. This is to avoid a great current from flowing to the DC power supply lines LH, LL via the converter 1 from the input end Px when the DC power supply lines LH, LL are short circuited with respect to one another. Therefore, in the power converter of FIG. 3, the boot capacitor Cbx1 is not charged in the normal operation of the inverter 3.

In the power converter of FIG. 2, on the other hand, only the switching element Ty1 may be conducted to charge the boot capacitor Cbx1. Therefore, the boot capacitor Cbx1 can be charged every time the switching element Ty1 is conducted even in the normal operation of the inverter 3. The electrostatic capacitance required by the boot capacitor Cbx1 thus can be reduced.

In the illustration of FIG. 2, a voltage between both ends of a boot capacitor Cbx2 is supplied to the drive circuit Drx2. One end of the boot capacitor Cbx2 is connected to the emitter electrode of the switching element Tx2 and the drive circuit Drx2. The other end of the boot capacitor Cbx2 is connected to the drive circuit Drx2, and one end on the high potential side of the boot capacitor Cbx1 by way of a diode Dbx2. The diode Dbx2 is arranged with the cathode directed towards the boot capacitor Cbx2. The diode Dbx2 prevents the boot capacitor Cbx2 from discharging towards the boot capacitor Cbx1.

In the illustration of FIG. 2, a level shift circuit LSx2 is connected to the drive circuit Drx2.

The boot capacitor Cbx2 is also charged prior to a normal operation of the power converter. For instance, the charging of the boot capacitor Cbx2 is executed after the charging of the boot capacitor Cbx1. Specifically, the boot capacitor Cbx2 can be charged by conducting the switching element Tx1. This is because the current flows to a serial circuit A3 including the boot capacitor Cbx1, the diode Dbx2, the boot capacitor Cbx2, and the switching element Tx1 by the conduction of the switching element Tx1.

Therefore, since the DC power supply is not used for the operation power supply for the switching element Tx2, the manufacturing cost can be reduced. In the normal operation of the converter 1, the switching element Tx1 is conducted and thus the boot capacitor Cbx2 is also charged during the normal operation. The electrostatic capacitance required by the boot capacitor Cbx2 thus can be reduced.

In the illustration of FIG. 2, the boot capacitor Cbx1 is charged with the boot capacitor Cby1 as the power supply, and thus the voltage between both ends of the boot capacitor Cby1 lowers in this case. Similarly, the voltage between both ends of the boot capacitor Cbx1 lowers when charging the boot capacitor Cbx2. Therefore, the charging operation of each boot capacitor Cbx1, Cbx2, Cby1 is desirably carried out repeatedly in the charging operation prior to the normal operation. The voltage lowering of the boot capacitor Cbx1, Cby1 caused by the consumption current of each drive circuit Drx1, Dry1 thus can be recovered, the voltage lowering of the boot capacitor Cbx1 caused by the charging of the boot capacitor Cbx2 can be recovered, and similarly, the voltage lowering of the boot capacitor Cby1 caused by the charging of the boot capacitor Cbx1 can be recovered.

After a desired voltage is charged to the boot capacitor Cby1, the switching elements Ty1, Ty2 may be simultaneously conducted if before the normal operation. The boot capacitor Cbx1 thus can be charged while suppressing the voltage lowering of the boot capacitor Cby1. In this case, the switching elements Tx1, Tx2 are switching elements that are normally turned OFF. The great current thus can be prevented from flowing to the converter 1 by the short circuit of the DC power supply lines LH, LL.

Similarly, after a desired voltage is charged to the boot capacitor Cby1, Cbx1, the switching elements Tx1, Ty1, Ty2 may be simultaneously conducted if before the normal operation. The boot capacitor Cbx2 thus can be charged while suppressing the voltage lowering of the boot capacitors Cby1, Cbx1.

Figure 4:
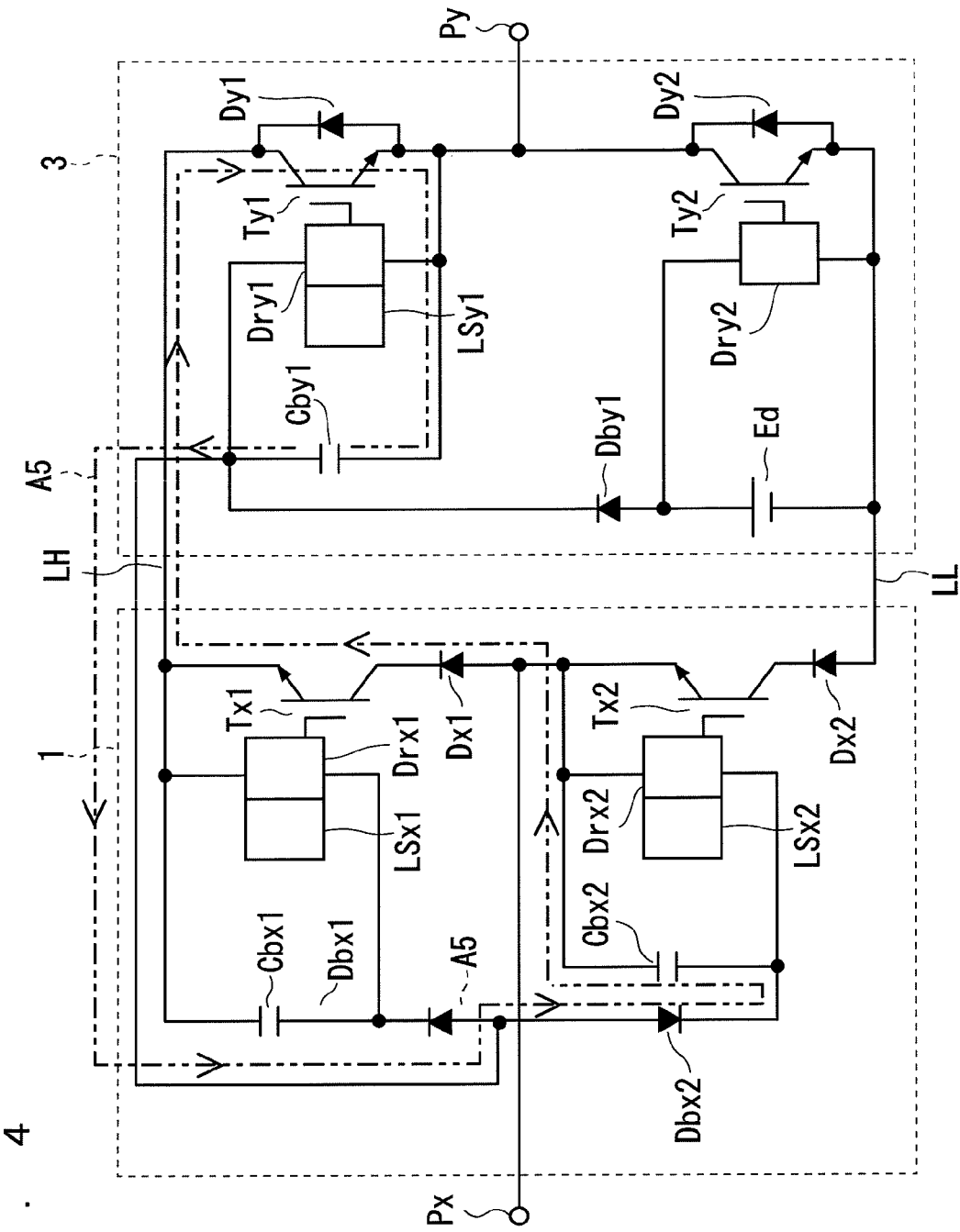

In the illustration of FIG. 2, the boot capacitor Cbx2 is charged with the boot capacitor Cbx1 as the power supply, but may be charged with the boot capacitor Cby1 as the power supply. In other words, as illustrated in FIG. 4, the anode of the diode Dbx2 may be connected to one end on the high potential side of the boot capacitor Cby1. In this case, the boot capacitor Cbx2 can be charged by simultaneously conducting the switching elements Tx1, Ty1. This is because the current flows to a serial circuit A5 including the boot capacitor Cby1, the diode Dbx2, the boot capacitor Cbx2, and the switching elements Tx1, Ty1 according to such conduction.

The manufacturing cost can be reduced since the DC power supply is not adopted for the switching element Tx2. The switching elements Tx1, Ty1 can be simultaneously conducted in the normal operation, and thus the boot capacitor Cbx2 can be charged even during the normal operation.

In the illustration of FIG. 2, the operation power supply is obtained from the boot capacitor Cby1 even for the switching element Ty1, but may be obtained from the DC power supply. Similarly, the switching elements Tx1, Tx2 both obtain the operation power supply from the boot capacitors Cbx1, Cbx2, but this is not the sole case. In other words, if the boot capacitor is used for one of the switching elements Tx1, Tx2, the manufacturing cost can be reduced and the relevant boot capacitor can be charged during the normal operation, and hence that having a small electrostatic capacitance can be adopted.

Description has been made with the converter 1 as a three-phase converter and the inverter 3 as a three-phase inverter, but this is not the sole case. The inverter 3 is not an essential requirement. In other words, the switching element and the power supply section being connected to the switching element on the DC power supply line side and functioning as the operation power supply merely need to be provided between such DC power supply line LH and the output end. This aspect is also similar in other embodiments described below.

Figure 5:
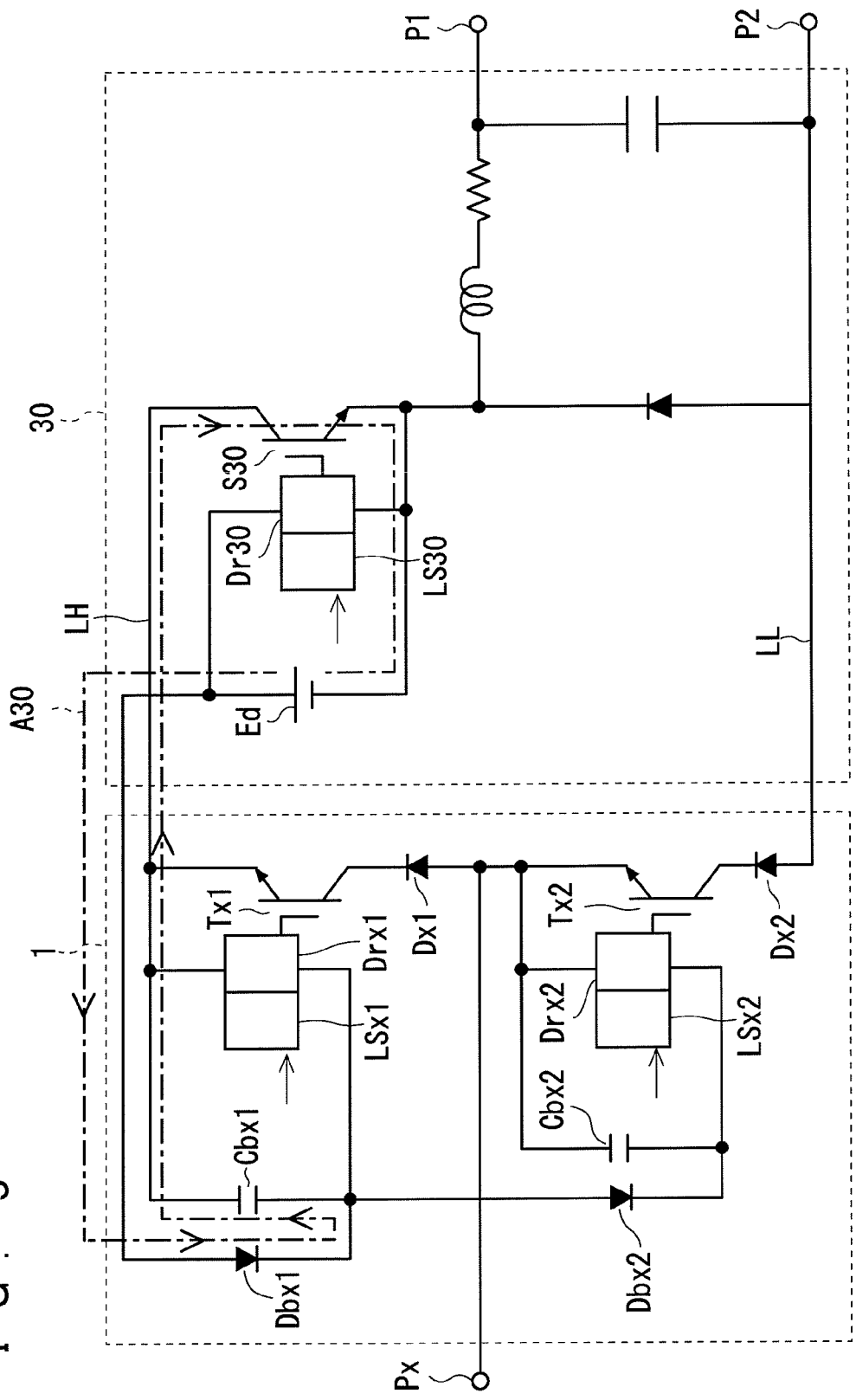
FIGS. 5 and 6 are views each showing one example of a conceptual configuration of a clamp circuit and a chopper circuit.

For instance, application can be made on a voltage step-down type chopper circuit 30 shown in FIG. 5. The chopper circuit 30 is connected to the output of the converter 1, for example, and is able to step down the DC voltage between the DC power supply lines LH, LL and output the same from output ends P1, P2. In the following description, only the portion related to the present embodiment will be described.

The chopper circuit 30 includes a switching element S30 arranged between the DC power supply line LH and the output end P1. The switching element S30 is, for example, an insulated gate bipolar transistor, and is arranged with the emitter electrode directed towards the output end P1 side. The DC power supply Ed is supplied to the switching element S30 as the operation power supply. One end on the low potential side of the DC power supply Ed is connected to the switching element S30 on the DC power supply line LL side. The drive circuit Dr30 and the level shift circuit LS30 are similar to the other drive circuits and level shift circuits, and thus the description thereof will be omitted.

One end on the high potential side of the DC power supply Ed is connected to one end on the high potential side of the boot capacitor Cbx1 by way of the diode Dbx1. The diode Dbx1 is arranged with the anode directed towards the DC power supply Ed. In such power converter, the current flows to a serial circuit A30 including the DC power supply Ed, the diode Dbx1, the boot capacitor Cbx1, and the switching element S30 by conducting the switching element S30. The boot capacitor Cbx1 is thereby charged.

<Operation Power Supply of Switching Element of Clamp Circuit 2>

Figure 6:
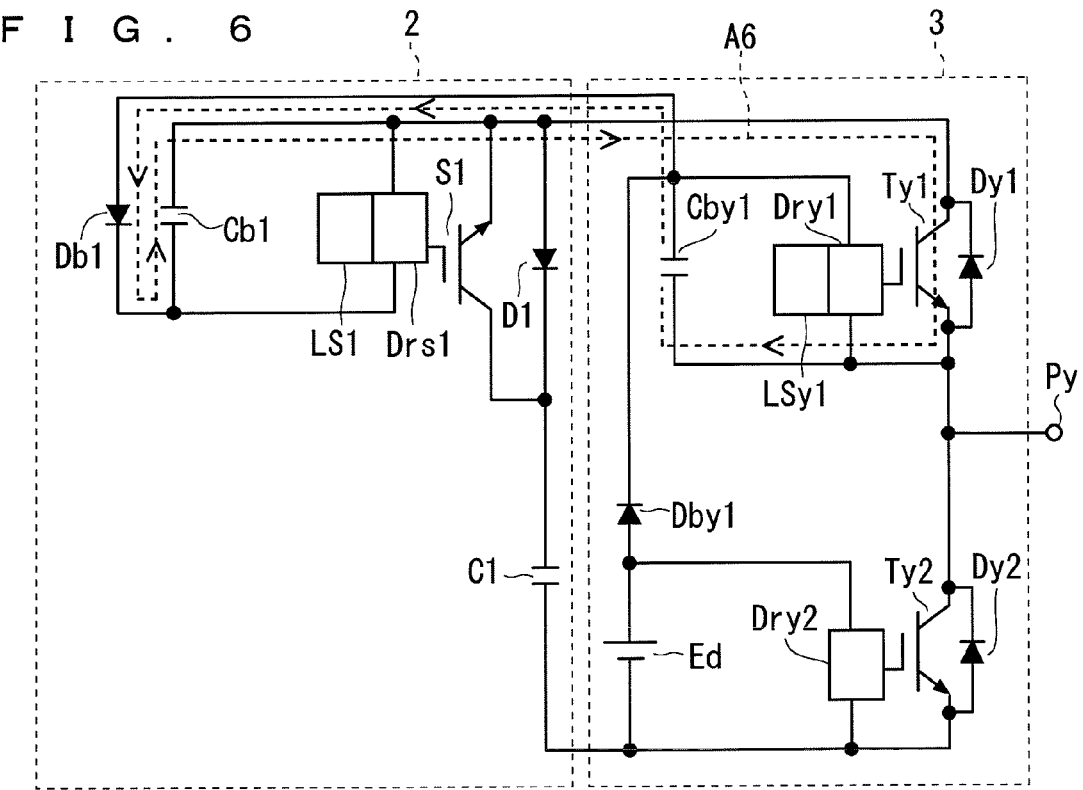

The operation power supply of the switching element S1 will now be described with reference to the illustration of FIG. 6. In the illustration of FIG. 6, the illustration of the converter 1 is omitted, and only one switching leg is illustrated for the inverter 3. Furthermore, the operation power supply for the switching elements Ty1, Ty2 is similar to the description made with reference to FIG. 2.

The clamp circuit 2 includes a drive circuit Drs1 for driving the switching element S1. The drive circuit Drs1 is connected to the gate electrode of the switching element S1. A level shift circuit LS1 is connected to the drive circuit Drs1.

A voltage between both ends of a boot capacitor Cb1 is supplied to the drive circuit Drs1 as the operation power supply. One end of the boot capacitor Cb1 is connected to the emitter electrode of the switching element S1 and the drive circuit Drs1. The other end of the boot capacitor Cb1 is connected to the drive circuit Drs1, and the one end on the high potential side of the boot capacitor Cby1 by way of a diode Db1. The diode Db1 is arranged with the anode directed towards the boot capacitor Cby1. The diode Db1 prevents the boot capacitor Cb1 from discharging towards the boot capacitor Cby1.

The boot capacitor Cb1 is charged prior to a normal operation of the present power converter. Specifically, the boot capacitor Cb1 can be charged using the charges accumulated in the boot capacitor Cby1 by conducting the switching element Ty1. This is because the current flows to a serial circuit A6 including the boot capacitor Cby1, the diode Db1, the boot capacitor Cb1, and the switching element Ty1 by the conduction of the switching element Ty1. The switching element S1 is conducted after the regenerative energy from the inverter 3 is accumulated in the capacitor C1. Therefore, the boot capacitor Cb1 is not necessarily charged prior to the normal operation, and may be charged during the normal operation.

As described above, the boot capacitor Cb1 is charged to function as the operation power supply for outputting the switch signal to the switching element S1. Therefore, the DC power supply does not need to be arranged for the switching element S1, and the manufacturing cost can be reduced.

Furthermore, the boot capacitor Cb1 can be charged by conducting only the switching element Ty1, similar to the boot capacitor Cbx1 of FIGS. 2 and 4. Therefore, the boot capacitor Cb1 can be charged even in the normal operation of the inverter 3, and the electrostatic capacitance required by the boot capacitor Cb1 can be reduced.

Figure 7:
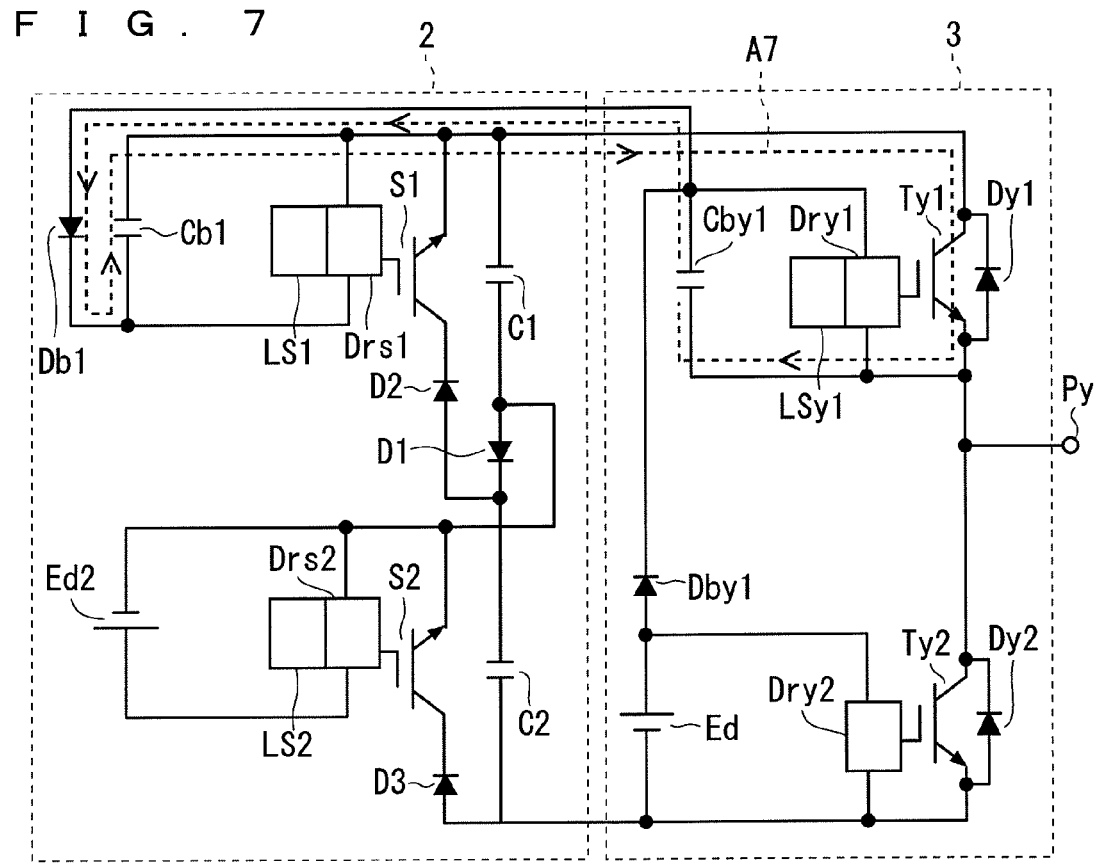
FIG. 7 is a view showing another example of a conceptual configuration of the clamp circuit and the inverter.

As illustrated in FIG. 7, the clamp circuit 2 may include capacitors C1, C2, switching elements S1, S2, and diodes D1 to D3. The capacitors C1, C2 and the diode D1 are connected in series to each other between the DC power supply lines LH, LL. The diode D1 is arranged between the capacitors C1, C2 with the anode directed towards the DC power supply line LH. The switching elements S1, S2 are, for example, insulated gate bipolar transistors. The switching element S1 and the diode D2 are connected in series to each other. The serial body of the switching element S1 and the diode D2 is arranged between the DC power supply line LH and the cathode of the diode D1. The switching element S1 is arranged with the emitter electrode directed towards the DC power supply line LH, and the diode D2 is arranged with the cathode directed towards the DC power supply line LH. The switching element S2 and the diode D3 are connected in series to each other. The serial body of the switching element S2 and the diode D3 is connected between the DC power supply line LL and the anode of the diode D1. The switching element S2 is arranged with the collector electrode directed towards the DC power supply line LL, and the diode D3 is arranged with the anode directed towards the DC power supply line LL.

According to the clamp circuit 2, the capacitors C1, C2 are charged in a series state with one another when the switching elements S1, S2 are non-conductive. Therefore, the withstanding voltage of the capacitors C1, C2 can be reduced compared to when one capacitor C1 is charged. The capacitors C1, C2 are discharged in a parallel state with one another when the switching elements S1, S2 are conducted.

The clamp circuit 2 includes drive circuits Drs1, Drs2 for driving the switching elements S1, S2, respectively. The drive circuits Drs1, Drs2 are respectively connected to the gate electrodes of the switching elements S1, S2. The level shift circuits LS1, LS2 are connected to the drive circuits Drs1, Drs2, respectively.

The operation power supply of the drive circuit Drs1 is similar to that of the clamp circuit 2 of FIG. 6. Therefore, the DC power supply does not need to be adopted for the operation power supply of the switching element S1, and the manufacturing cost can be reduced. Furthermore, the boot capacitor Cb1 can be charged even during the normal operation.

The operation power supply is supplied from a DC power supply Ed2 to the drive circuit Dr2. The DC power supply Ed2 has one end on the low potential side connected to the emitter electrode of the switching element S2. The boot capacitor is not adopted as the operation power supply of the drive circuit Drs2 in this case. This is for the following reasons. Assume a circuit in which the DC power supply Ed2 is replaced with a boot capacitor Cb2, and the boot capacitor Cb2 and the boot capacitor Cb1 are connected with a diode. The boot capacitors Cb1, Cb2 and the capacitor C1 are always short circuited. An excessively large voltage is voltage divided to both or one of the boot capacitors Cb1, Cb2 by such short-circuit thus inhibiting the boot capacitors Cb1, Cb2 from obtaining the desired voltage.

If the boot capacitor is arranged with respect to the switching element of the clamp circuit 2, the converter 1 is not an essential requirement. If the converter 1 and the clamp circuit 2 are arranged, and the emitters of the switching element S1 and the switching element Tx1 are connected to a common potential (e.g., DC power supply line LH), the boot capacitor merely needs to be arranged with respect to one of the switching elements thereof.

<Another Example of Power Converter>

A power converter of FIG. 8 differs from the power converter of FIG. 1 in the configuration of the converter 1. In the illustration of FIG. 8, the clamp circuit 2 of FIG. 1 is adopted for the clamp circuit 2, but such configuration is not the sole case, and the clamp circuit 2 of FIG. 7 may be adopted, for example. The clamp circuit 2 may not be arranged.

The converter 1 has switching legs for the r, s, and t phases. The switching leg of the r phase includes a switching elements Tr and diodes Dr1 to Dr4. The switching leg of the s phase includes a switching elements Ts and diodes Ds1 to Ds4. The switching leg of the t phase includes a switching elements Tt, and diodes Dt1 to Dt4. The switching legs of the r, s, and t phases are connected in parallel to each other between the DC power supply lines LH, LL.

The switching elements Tx (x represents r, s, t) is, for example, an insulated gate bipolar transistor. The switching elements Tx and the diodes Dx1, Dx2 are connected in series to each other between the DC power supply lines LH, LL. The diode Dx1 is arranged on the DC power supply line LH side with respect to the switching element Tx, and the diode Dx2 is arranged on the DC power supply line LL side with respect to the switching element Tx. The switching element Tx is arranged with the emitter electrode directed towards the DC power supply line LH, and the diodes Dx1, Dx2 are arranged with the cathode directed towards the DC power supply line LH. The diodes Dx1, Dx2 exhibit a reverse blocking ability of the converter 1. The diode Dx3 has the anode connected to a node between the switching element Tx and the diode Dx1, and the cathode connected to the input end Px. The diode Dx4 has the anode connected to the input end Px and the cathode connected to a node between the switching element Tx and the diode Dx2.

According to such converter 1, the number of switching elements can be reduced, and hence the manufacturing cost can be reduced.

<Operation Power Supply of Switching Element of Converter 1>

Figure 9:
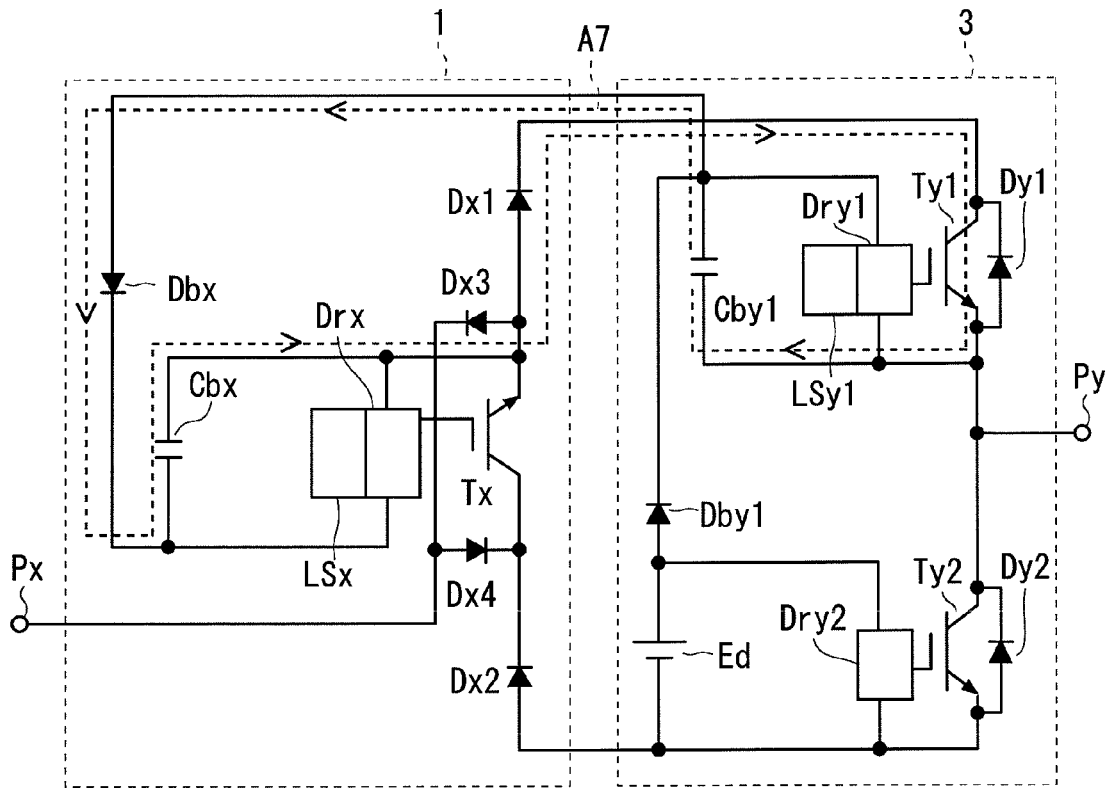

The operation power supplies of the switching elements Tx, Ty1, Ty2 will now be described with reference to FIG. 9. In the illustration of FIG. 9, only one switching leg of the converter 1 and one switching leg of the inverter 3 are representatively illustrated, The operation power supplies of the switching element Ty1, Ty2 are similar to the description made with reference to FIG. 1, and thus the description will be omitted.

The converter 1 includes the drive circuit Drx for driving the switching element Tx. The drive circuit Drx is connected to the gate electrode of the switching clement Tx. The level shift circuit LSx is connected to the drive circuit Drx.

The voltage between both ends of the boot capacitor Cbx is supplied to the drive circuit Drx as the operation power supply. One end of the boot capacitor Cbx is connected to the emitter electrode of the switching element Tx and the drive circuit Drx. The other end of the boot capacitor Cbx is connected to the drive circuit Drx, and one end on the high potential side of the boot capacitor Cby1 by way of the diode Dbx. The diode Dbx is arranged with the cathode directed towards the boot capacitor Cbx. The diode Dbx prevents the boot capacitor Cbx from discharging towards the boot capacitor Cby1.

The boot capacitor Cbx is charged prior to a normal operation of the power converter. Specifically, the boot capacitor Cbx can be charged by conducting the switching element Ty1. This is because the current flows to a serial circuit A7 including the boot capacitors Cby1, Cbx, the diodes Dbx, Dx1, and the switching element Ty1 by the conduction of the switching element Ty1. Therefore, the DC power supply does not need to be used for the switching element Tx, and hence the manufacturing cost can be reduced. Furthermore, the electrostatic capacitance required by the boot capacitor Cbx can be reduced since the boot capacitor Cbx can be charged every time the switching element Ty1 is conducted even during the normal operation.

Second embodiment

In the first embodiment, variation occurs in the voltage of the operation power supply of each switching element. The voltage tends to become lower towards the operation power supply of the post process.

For instance, with reference to FIG. 2, the boot capacitor Cby1 is charged via the diode Dby1 and the switching element Ty2 with the DC power supply Ed as the power supply. Therefore, the voltage between both ends of the boot capacitor Cby1 is smaller than the voltage of the DC power supply Ed by the sum of the forward voltage of the diode Dby1 and the voltage between the emitter and the collector of the switching element Ty2. Similarly, the voltage between both ends of the boot capacitor Cbx1 is smaller than the voltage between both ends of the boot capacitor Cby1 by the sum of the forward voltage of the diode Dbx1 and the voltage between the emitter and the collector of the switching element Ty1. Similarly, the voltage between both ends of the boot capacitor Cbx2 is smaller than the voltage between both ends of the boot capacitor Cbx1 by the sum of the forward voltage of the diodes Dbx2, Dx1 and the voltage between the emitter and the collector of the switching element Tx1.

Assume here that the forward voltages of the diodes Dby2, Dbx1, Dbx2, and Dx1 are equal to each other, and the voltages between the emitter and the collector of the switching elements Tx1, Ty1, and Ty2 are equal to each other to simplify the explanation. Under such assumption, the voltage of the DC power supply Ed is the highest, and then the voltage between both ends of the boot capacitor Cby1 is the next highest, the voltage between both ends of the boot capacitor Cbx1 is the next highest, and the voltage between both ends of the boot capacitor Cbx2 is the lowest. More specifically, each voltage between both ends is expressed with the following equation.

$$Vcby1=Ved-Vf-Vce \quad (1)$$

$$Vcbx1=Vcby1-Vf-Vce=Ved-2Vf-2Vce \quad (2)$$

$$Vcbx2=Vcbx1-2Vf-Vce=Ved-4Vf-3Vce \quad (3)$$

Here, Ved, Vcbx1, Vcbx2, Veby1 are the voltages between both ends of the DC power supply Ed, and the boot capacitors Cbx1, Cbx2, Cby1. Vf is the forward voltage of the diodes Dby1, Dbx1, Dbx2, and Dx1. Vice is the voltage between the emitter and the collector of the switching elements Tx1, Ty1, Ty2.

If the variation in voltage for such operation power supply can be resolved, the same switching element can be adopted, for example, and the variation in the switching characteristics and the like of each switching element can be reduced. In the second embodiment, the variation in the operation voltage of each switching element is reduced.

Figure 10:
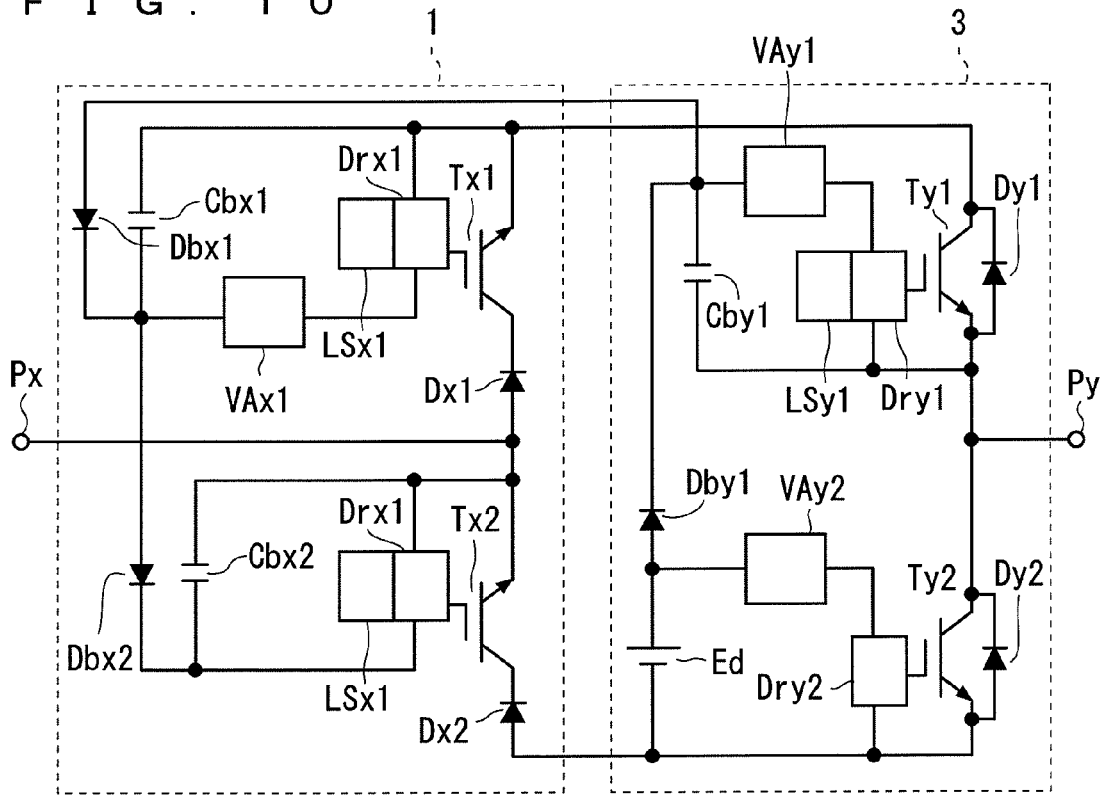

First, description will be made in correspondence with the power converter of FIG. 1. As shown in FIG. 10, the present power converter further includes voltage adjustment circuits VAy1, VAy2, VAx1. In the illustration of FIG. 10, only one switching leg of the converter 1 and one switching leg of the inverter 3 are representatively illustrated.

The voltage adjustment circuit VAx1 is connected, for example, between one end on the high potential side of the boot capacitor Cbx1 and the drive circuit Drx1. The voltage adjustment circuit VAx1 is, for example, a resistor, and steps down the voltage between both ends of the boot capacitor Cbx1 and supplies the same to the drive circuit Drx1 as the operation power supply. As a more specific example, the voltage between both ends of the boot capacitor Cbx1 is stepped down by the sum of twice the voltage Vf and the voltage Vce and supplied as the operation power supply. The operation power supply to be supplied to the drive circuits Drx1, Drx2 thus can be made equal (see equation (2) and equation (3)).

The voltage adjustment circuit VAy1 is connected between one end on the low potential side or the high potential side of the boot capacitor Cby1 and the drive circuit Dry1. The voltage adjustment circuit VAy1 is, for example, a resistor, and steps down the voltage between both ends of the boot capacitor Cby1 and supplies the same to the drive circuit Dry1 as the operation power supply. More specifically, the voltage between both ends of the boot capacitor Cby1 is stepped down by the sum of three times the voltage Vf and twice the voltage Vce and supplied as the operation power supply.

The voltage adjustment circuit VAy2 is connected between one end on the high potential side of the DC power supply Ed and the drive circuit Dry2. The voltage adjustment circuit VAy2 is, for example, a resistor, and steps down the voltage of the DC power supply Ed and supplies the same to the drive circuit Dry2 as the operation power supply. More specifically, the voltage of the DC power supply Ed is stepped down by the sum of four times the voltage Vf and three times the voltage Vce and supplied as the operation power supply.

The operation voltages of the drive circuits Drx1, Drx2, Dry1, Dry2 can be made equal to each other by each voltage adjustment circuit VAx1, VAy1, VAy2.

Figure 11:
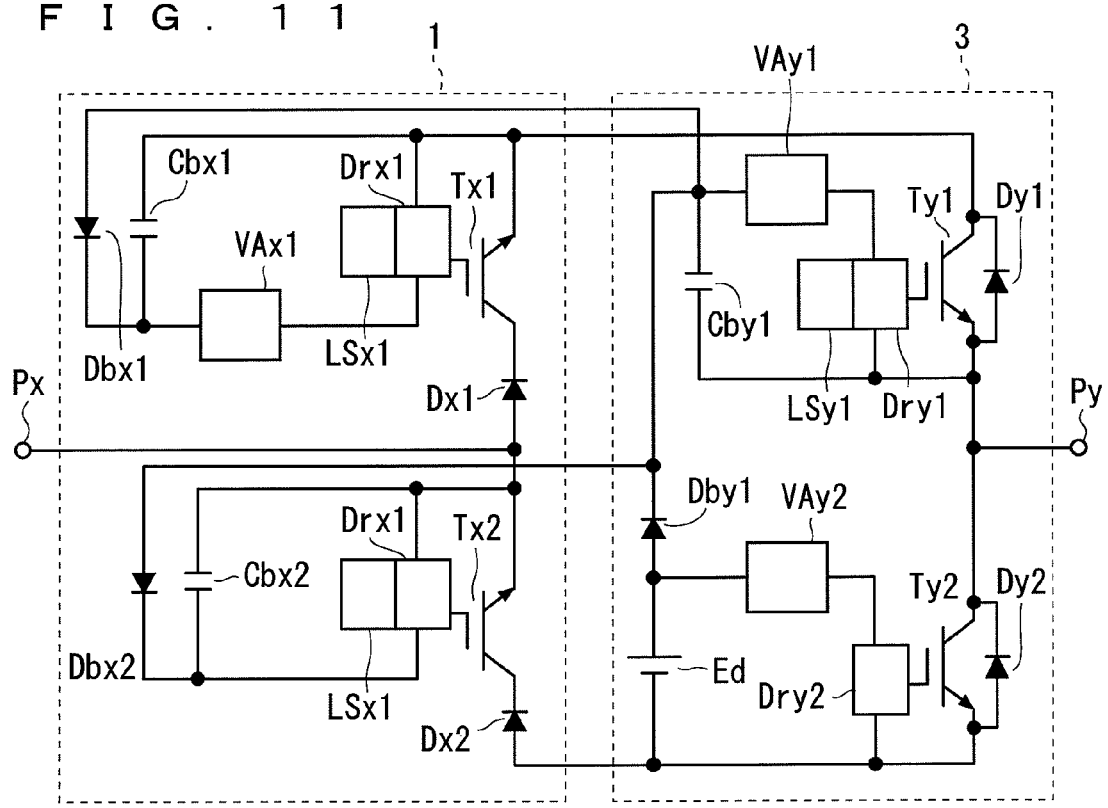

As shown in FIG. 11, the voltage adjustment circuits VAx1, VAy1, and VAy2 are also arranged with respect to the power converter of FIG. 4. The voltage between both ends Vcby1, Vcbx1, Vcbx2 of each boot capacitor Cby1, Cbx1, Cbx2 can be expressed with the following equation.

$$Vcby1=Ved-Vf-Vce \quad (4)$$

$$Vcbx2=Vcby1-Vf-Vce=Ved-2Vf-2Vce \quad (5)$$

$$Vcbx2=Vcby1-2Vf-2Vce=Ved-3Vf-3Vce \quad (6)$$

Therefore, the voltage drop of the voltage adjustment circuit VAy2 is desirably the sum of three times the voltage Vf and three times the voltage Vce, the voltage drop of the voltage adjustment circuit VAy1 is desirably the sum of twice the voltage Vf and twice the voltage Vce, and the dropped voltage of the voltage adjustment circuit VAx1 is desirably the sum of the voltage Vf and the voltage Vce. The operation voltages of the drive circuits Drx1, Drx2, Dry1, and Dry2 thus can be made equal to each other.

The power consumption generated in the voltage adjustment circuit VAx1 can be reduced since the voltage dropped in the voltage adjustment circuit VAx1 is small compared to the power converter of FIG. 10.

Figure 12:
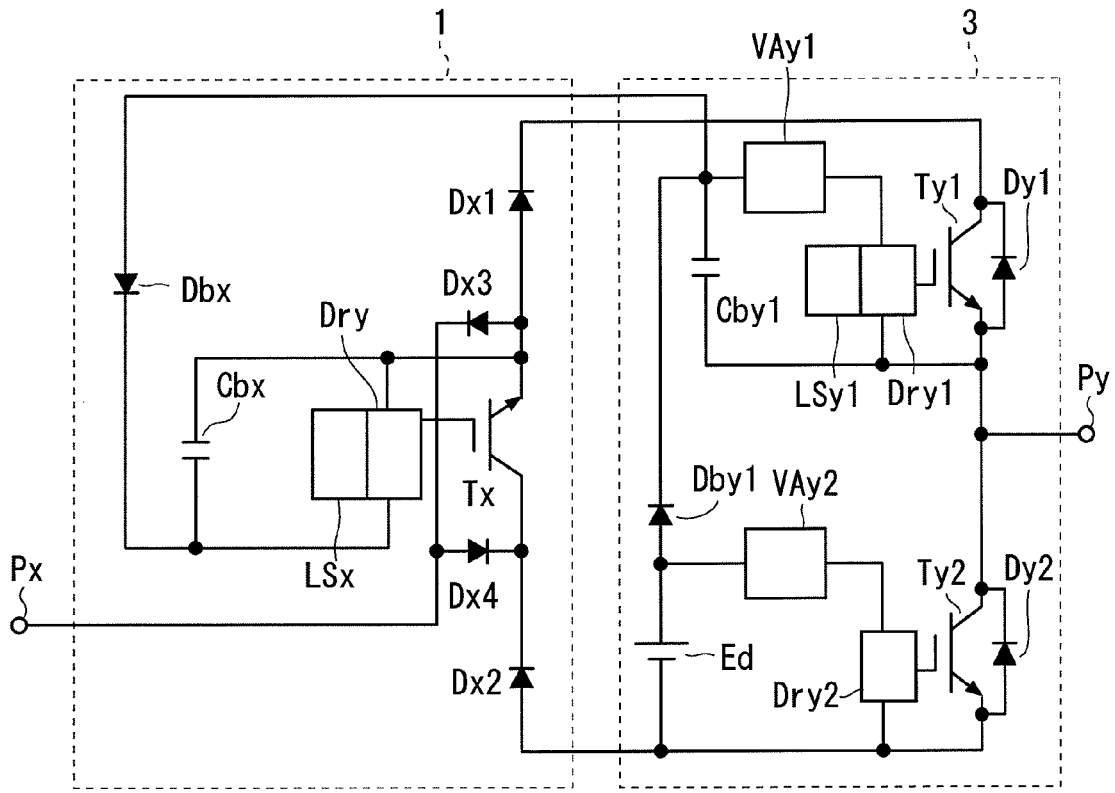

Furthermore, as shown in FIG. 12, the voltage adjustment circuits VAy1, VAy2 may be arranged with respect to the boot capacitor Cby1 and the DC power supply Ed, respectively, with respect to the power converter of FIGS. 8 and 9. In this case, the voltage drop of the voltage adjustment circuit VAy2 may be the sum of three times the voltage Vf and twice the voltage Vce, and the voltage drop of the voltage adjustment circuit VAy1 may be the sum of twice the voltage Vf and the voltage Vce. This aspect is similar in the power converter of FIGS. 6 and 7.

The voltage adjustment circuit is not limited to the mode described herein. For instance, a mode of voltage dividing the voltage of the boot capacitor, or a mode of obtaining a constant voltage by a zener diode may be adopted. Moreover, a mode of connecting an input of a regulator to both ends of the boot capacitor, and connecting an output of the regulator to the drive circuit may be adopted.

Third Embodiment

In FIGS. 1 and 2, the switching elements Tr1, Ts1, Tt1 are connected to the DC power supply line LH. In other words, the diodes Dr1, Ds1, Dt1 are respectively positioned on the input ends Pr, Ps, Pt side than the switching elements Tr1, Ts1, Tt1. The DC power supply line LH thereby functions as a common potential of the switching elements Tr1, Te1, Tt1. Therefore, one boot capacitor can be caused to function as the operation power supply for outputting the switch signal to the three switching elements Tx1. In other words, the voltage between both ends of one boot capacitor is supplied as the operation power supply to the three drive circuits Drx1 for respectively driving the three switching elements Tx1. The number of boot capacitors thus can be reduced.

The one boot capacitor may function as the operation power supply for outputting the switch signal to the switching element S1 of the clamp circuit 2 of FIGS. 1 and 4. Furthermore, if the switching element S1 is directly connected to the DC power supply line LH in the clamp circuit 2 of FIG. 7, such one boot capacitor can be caused to function as the operation power supply for outputting the switch signal to the switching element S1.

Figure 13:
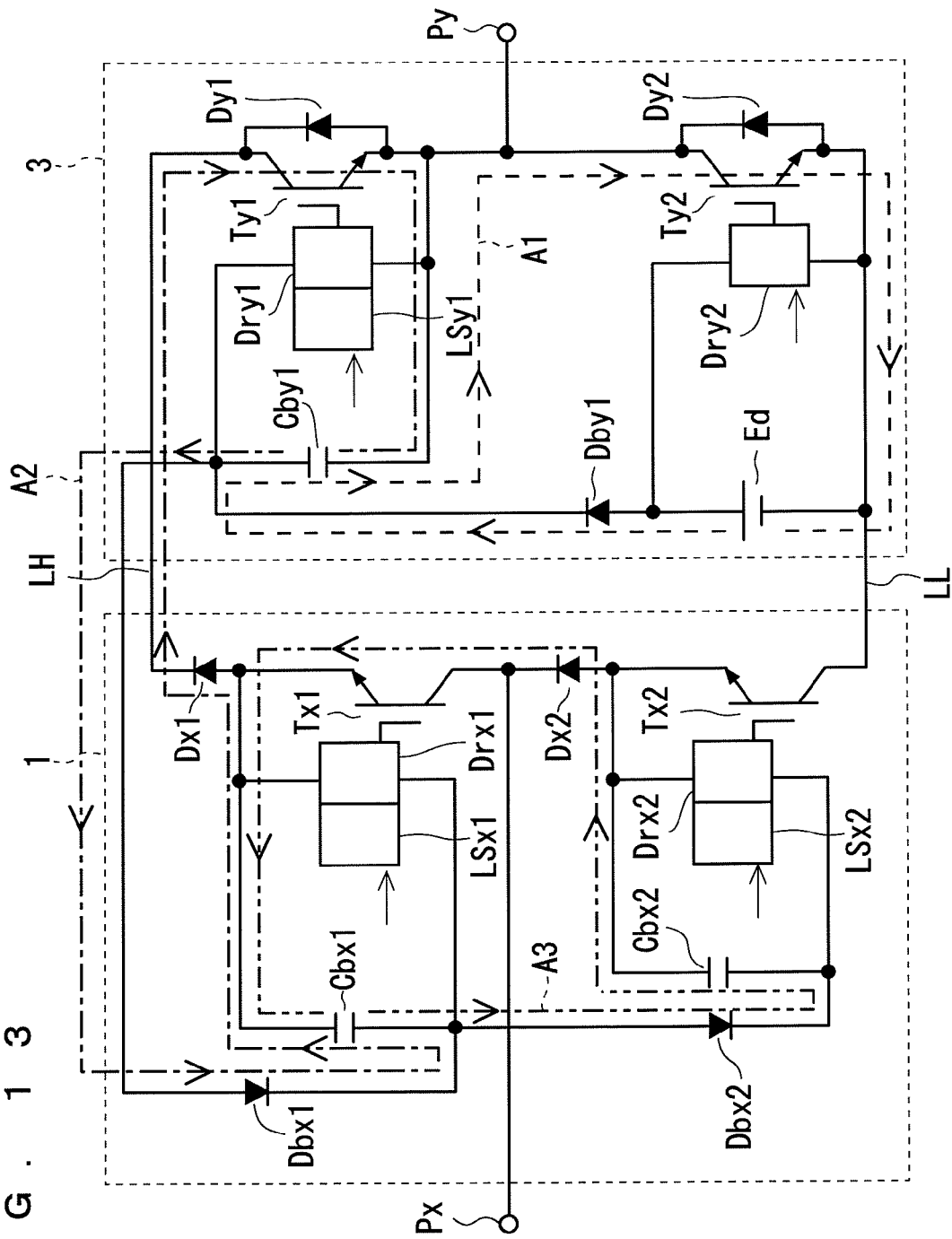

If the boot capacitor is not made common with respect to the switching element Tx1, the diode Dx1 may be arranged on the DC power supply line LH side with respect to the switching element Tx1, as shown in FIG. 13. More specifically, the diode Dx1 may be arranged on the DC power supply line LH side than a connecting point of the switching element Tx1, the boot capacitor Cbx1, and the drive circuit Drx1.

Fourth Embodiment

In the illustration of FIGS. 1, 2, and 4, the switching element Tx1 and the diode Dx1 are connected in series to each other, but the functions thereof may be realized with one switching element. For instance, a reverse blocking insulated gate bipolar transistor of mesa type or separation inhibiting type may be adopted. The switching element can be understood as having a reverse blocking structure.

With the use of such switching element, the voltage drop by the forward voltage of the diode Dx1 in the charging path (serial circuit A3, A5) can be avoided. The voltage between both ends of the boot capacitor Cbx2 thus can be enhanced.

Consider applying the third embodiment to the present embodiment. Since the voltage drop by the forward voltage of the diode Dx1 of the boot capacitor Cbx2 can be avoided, the voltage drop of each voltage adjustment circuit VAx1, VAy1, VAy2 may be increased by the amount of voltage Vf.

Similar effects can also be expected in the circuit shown in FIG. 11.

Fifth Embodiment

In the power converter of FIGS. 2 and 4, the diode Dbx2 may not be arranged. Since the diode Dx1 is arranged on the charging path (serial circuit A3, A5) of the boot capacitor Cbx2, such diode Dx1 can prevent the boot capacitor Cbx2 from discharging towards the boot capacitor Cbx1. In other words, the diode Dx1 exhibits the reverse blocking ability of the converter, and also prevents the discharging of the boot capacitor Cbx2 through the charging path. Therefore, the number of diodes can be reduced, and furthermore, the manufacturing cost can be reduced compared with the case the diodes Dx1, Dbx2 are individually arranged.

In the power converter of FIG. 13, the diode Dx1 is interposed on the charging path (serial circuit A2 of FIG. 13) of the boot capacitor Cbx1. Therefore, the diode Dx1 performs the function of the diode Dbx1 on the serial circuit A2. However, the diode Dbx1 is desirably arranged. This is because the boot capacitor Cbx1 may be discharged towards the boot capacitor Cby1 through a path not passing the diode Dx1 in the normal operation. This will be described in detail below.

Assume that the voltage Vc is charged in the boot capacitors Cbx1, Cby1 and the voltage drop of each switching element and each diode is zero to simplify the explanation. Assume also that the potential applied to the DC power supply line LL is zero.

For instance, a case in which the phase voltage Vr applied to the input end Pr is greater than the phase voltage Vs applied to the input end Ps and the switching elements Tr1, Ts2 are conducted will be described by way of example with reference to FIG. 1. However, the arrangement of the switching elements Tr1, Ts1, Tt1 and the diodes Dr1, Ds1, Dt1 is reversed in FIG. 1. The input end Ps is connected to the power supply line LL by the conduction of the switching element Ts2. The input end Pr is connected to the power supply line LH by the conduction of the switching element Tr1. The potential difference between the DC power supply line LH and the DC power supply line LL is the difference of the phase voltages Vr, Vs, that is, the line voltage Vrs (>0).

The reference symbol x will be understood by being replaced with the reference symbol r in FIG. 13. The potential of the emitter electrode and the collector electrode is equal to each other since the switching element Tr1 is conducted. The potential on the low potential side of the boot capacitor Cbr1 is the line voltage Vrs. The potential on the high potential side of the boot capacitor Cbr1 is the sum of the line voltage Vrs and the voltage Vc in view of the voltage Vc of the boot capacitor Cbr1.

In this case, if the switching element Ty2 is conducted, the potential on the low potential side of the boot capacitor Cby1 is zero and the potential on the high potential side is the voltage Vc. Therefore, the potential (Ye+Yrs) on the high potential side of the boot capacitor Cbr1 becomes higher than the potential (Vc) on the high potential side of the boot capacitor Cby1. In this case, therefore, the boot capacitor Cbr1 may be discharged to the boot capacitor Cby1 through a path not passing the diode Dr1.

The diode Dbr1 is desirably arranged since the diode Dbr1 can prevent such discharging. From the standpoint of preventing the discharging during the normal operation, the diode Dbr1 merely needs to be arranged between the boot capacitor Cby1 and the connecting point of the diode Dx1 and the switching element Tx1.

The diode Dbx may not be arranged in the power converter of FIG. 9. This is because the diode Dx1 realizes the function of the diode Dbx1 in the serial circuit A7, and furthermore, the diode Dx3 prevents the discharging of the boot capacitor Cbx in the normal operation. Therefore, the number of the diodes can be reduced, and the manufacturing cost can be reduced.

According to the above content (particularly power converter of FIG. 9), the diode (diode Dbx or diode Dx1) that prevents the discharging from the boot capacitor Cbx (or boot capacitor Cbx1, Cbx2) can be understood as being arranged on a path from one end on the high potential side of the boot capacitor Cby1 to the DC power supply line LH through the boot capacitor Cbx1. This understanding can be applied to all the power converters of FIG. 1 to FIG. 7.

Sixth Embodiment

In the power converter of FIGS. 1, 2, and 4, the diode Dx2 is arranged on the DC power supply line LL side with respect to the switching element Tx2. More specifically, the diode Dx2 is arranged on the DC power supply line LL side than a point where the switching element Tx2, the drive circuit Drx2, and the boot capacitor Cbx2 are commonly connected. The diode Dx2 is not interposed on the charging path (serial circuits A3, A5) of the boot capacitor Cbx2. Therefore, lowering in voltage does not occur by the forward voltage of the diode Dx2 when charging the boot capacitor Cbx2. In other words, the voltage between both ends of the boot capacitor Cbx2 can be enhanced.

If the effect of enhancing the voltage between both ends of the boot capacitor Cbx2 is not expected, the diode Dx2 may be arranged on the input end Px side of the switching element Tx2, as shown in FIG. 13. More specifically, the diode Dx2 may be arranged on the input end Px side of a connecting point of the switching element Tx2, the boot capacitor Cbx2, and the drive circuit Drx2.

Seventh Embodiment

The performance of the boot capacitor and the switching element will now be reviewed. The electrostatic capacitance of each boot capacitor is set so that a voltage of greater than or equal to a value (ON voltage) at which each switching element can be conducted is charged to each boot capacitor over a period of normal operation. The switching elements, capable of ensuring the conduction period of the time in which the boot capacitors Cbx2, Cbx1, Cby1, Cb1, Cbx can be sufficiently charged, are adopted as the switching elements Tx1, Ty1, Ty2, S30 respectively.

The selection of the boot capacitor is carried out in view of the ON voltage of each switching element, the charge amount consumed by the turning ON of each switching element, the consumption current of each drive circuit, the control method of the converter 1 and the inverter 3, and the like.

Eighth Embodiment

A power converter shown in FIG. 14 differs from the power converter shown in FIG. 1 in the presence or absence of the clamp circuit 2 and in the configuration of the converter 1. The present power converter does not include the clamp circuit 2. This is because the converter 1 has a configuration capable of being regenerated towards the input end Pr, Ps, Pt side (hereinafter also referred to as power supply side), as will be described later. However, this does not inhibit the installation of the clamp circuit for protection and the like during the operation abnormality.

The switching leg of the r phase includes switching elements Tr11, Tr12, Tr21, Tr22 and diodes Dr11, Dr12, Dr21, Dr22. The switching leg of the s phase includes switching elements Ts11, Ts12, Ts21, Ts22 and diodes Ds11, Ds12, Ds21, Ds22. The switching leg of the t phase includes switching elements Tt11, Tt12, Tt21, Tt22 and diodes Dt11, Dt12, Dt21, Dt22. The switching legs of the r phase, the s phase, and the t phase are connected in parallel to each other between the DC power supply lines LH, LL.

The switching elements Tx11, Tx12, Tx21, Tx22 (x represents r, s, are one-directional control switching elements for conducting/non-conducting only the current flowing from the second electrode to the first electrode. For instance, in the case of the insulated gate bipolar transistor, only the current flowing from the collector electrode to the emitter electrode (so-called current in forward direction) is conducted/non-conducted. In the insulated gate bipolar transistor, for example, the current (so-called current in reverse direction) does not flow from the first electrode (emitter electrode) to the second electrode (collector electrode). Such switching element is also referred to as a one-directional conduction switching element. An MOS (Metal-Oxide-Semiconductor) field effect transistor, for example, structurally has a parasitic diode conducted in reverse direction, and thus the current flows from the first electrode (source electrode) to the second electrode (drain electrode).

The switching element Tx11 and the diode Dx11 are connected in series to each other, the switching element Tx12 and the diode Dx12 are connected in series to each other, the switching element Tx21 and the diode Dx21 are connected in series to each other, and the switching element Tx22 and the diode Dx22 are connected in series to each other. The switching elements Tx11, Tx21 are arranged with the emitter electrode directed towards the DC power supply line LH, and the diodes Dx11, Dx21 are arranged with the cathode directed towards the DC power supply line LH. The switching elements Tx12, Tx22 are arranged with the emitter electrode directed towards the DC power supply line LL, and the diodes Dx12, Dx22 are arranged with the cathode directed towards the DC power supply line LL.

A serial body of the switching element Tx11 and the diode Dx11, and a serial body of the switching element Tx12 and the diode Dx12 are connected in parallel to each other between the input end Px and the DC power supply line LH. A serial body of the switching element Tx21 and the diode Dx21, and a serial body of the switching element Tx22 and the diode Dx22 are connected in parallel to each other between the input end Px and the DC power supply line LL.

In such configuration, the switching elements Tx11, Tx12, and the diodes Dx11, Dx12 configure a so-called bi-directional switching element. Similarly, the switching elements Tx21, Tx22, and the diodes Dx21, Dx22 configure a so-called bi-directional switching element. Therefore, the converter 1 can flow current from the DC power supply line LH, LL towards the input end Px. In other words, the regenerative energy from the inverter 3 can be regenerated towards the power supply.

The operation power supply for outputting a switching signal to the switching element Tx11, Tx12, Tx21, Tx22 will now be described with reference to FIG. 15.

The drive circuits Drx11, Drx12, Drx21, Drx22 are respectively connected to the gate electrodes of the switching elements Tx11, Tx12, Tx21, Tx22. The level shift circuits LSx11, LSx12, LSx21 are respectively connected to the drive circuits Drx11, Drx12, Drx21.

The voltage between both ends of the boot capacitor Cbx11 is supplied to the drive circuit Drx11 as the operation power supply. The diode Dbx11 is arranged between the boot capacitors Cbx11, Cby1. The boot capacitor Cbx11 and the diode Dbx11 are the same as the boot capacitor Cbx1 and the diode Dbx1, respectively, in the first embodiment, and thus the detailed description thereof will be omitted.

The voltage between both ends of the boot capacitor Cbx12 is supplied to the drive circuit Drx12 as the operation power supply. One end of the boot capacitor Cbx12 is connected to the emitter electrode of the switching element Tx12 and the drive circuit Drx12. The other end of the boot capacitor Cbx12 is connected to the drive circuit Drx12.

The other end of the boot capacitor Cbx12 is connected to one end on the high potential side of the boot capacitor Cbx11 by way of the diode Dbx12. The diode Dbx12 prevents the boot capacitor Cbx12 from discharging towards the boot capacitor Cbx11.

In such configuration, the boot capacitor Cbx12 can be charged using the charges accumulated in the boot capacitor Cbx11 by conducting the switching element Tx11. This is because the current flows to a serial circuit A8 including the boot capacitor Cbx11, the diode Dbx12, the boot capacitor Cbx12, the diode Dx11, and the switching element Tx11 by such conduction.

Therefore, the boot capacitor Cbx12 is charged to function as the operation power supply for outputting the switch signal to the switching element Tx12. Therefore, the DC power supply does not need to be provided for the switching element Tx12, and the manufacturing cost can be reduced. Furthermore, the boot capacitor Cbx12 is charged during the normal operation since the switching element Tx11 is conducted even in the normal operation of the converter 1. The electrostatic capacitance required by the boot capacitor Cbx12 thus can be reduced.

In the serial circuit A8, the diode Dx11 also functions as the diode Dbx12. In the normal operation, the boot capacitor Cbx12 is not discharged through a path other than the serial circuit A8. Therefore, the diode Dbx12 may not be arranged.

The voltage between both ends of the boot capacitor Cbx22 is supplied to the drive circuit Drx22 as the operation power supply. In the illustration of FIG. 15, the switching element Tx22 is arranged on the DC power supply line LL side of the diode Dx22. Therefore, the emitter electrode of the switching element Tx22 is directly connected to the DC power supply line LL. The DC power supply line LL thus functions as a common potential of the switching elements Ty2, Tx22. In the illustration of FIG. 15, therefore, the boot capacitor Cbx22 is connected in parallel with the DC power supply Ed, and the potential same as the DC power supply Ed is supplied as the operation voltage of the switching element Tx22. In this case, the DC power supply Ed. may function as the operation power supply of the switching element Tx22 without arranging the boot capacitor Cbx22.

The voltage between both ends of the boot capacitor Cbx21 is supplied to the drive circuit Dr21 as the operation power supply. One end of the boot capacitor Cbx21 is connected to the emitter electrode of the switching element Tx21 and the drive circuit Drx21. The other end of the boot capacitor Cbx21 is connected to the drive circuit Drx21. The other end of the boot capacitor Cbx21 is connected to one end on the high potential side of the boot capacitor Cbx22 by way of the diode Dbx21. The diode Dbx21 is arranged with the anode directed towards the boot capacitor Cbx22. The diode Dbx21 prevents the boot capacitor Cbx21 from discharging towards the boot capacitor Cbx22.

In such configuration, the boot capacitor Cbx21 can be charged using the charges (or DC power supply Ed) accumulated in the boot capacitor Cbx22 by conducting the switching element Tx22. This is because the current flows to a serial circuit A9 including the boot capacitor Cbx22 (or DC power supply Ed), the diode Dbx21, the boot capacitor Cbx21, the diode Dx22, and the switching element Tx22 by such conduction.

Therefore, the boot capacitor Cbx21 is charged to function as the operation power supply for outputting the switch signal to the switching element Tx21. Therefore, the DC power supply does not need to be arranged for the switching element Tx21, and the manufacturing cost can be reduced. Furthermore, in the normal operation of the converter 1, the switching element Tx22 is conducted when regenerating the regenerative energy from the inverter 3 to the power supply side, and hence the boot capacitor Cbx22 is charged in the normal operation.

During power running in which the current is flowed from the power supply to the load 4 in the normal operation, the boot capacitor Cbx21 is charged through the switching element Tx21 and the diode Dx21 with the DC power supply Ed as the power supply. This will be described below. First, during such power running, a relatively large operation current flows in the forward direction through the switching element Tx21 and the diode Dx21 from the inverter 3 by the conduction of the switching element Tx21. More specifically, the operation power supply flows from the output end Py to the input end Px via the switching element Ty2, the DC power supply line LL, the diode Dx21, and the switching element Tx21. The charging current flowed from the DC power supply Ed to the boot capacitor Cbx21 to charge the boot capacitor Cbx21 is smaller than the operation current described above. Therefore, as a whole, the current flows in the forward direction through the switching element Tx21 and the diode Dx21, but the charging current can flow in the reverse direction through the switching element Tx21 and the diode Dx21. More specifically, the charging current flows to the serial circuit including the DC power supply Ed, the diode Dx21, the boot capacitor Cbx21, the switching element Tx21, and the diode Dx21.

In the actual phenomenon, however, only the current in the forward direction flows to the switching element Tx21 and the diode Dx21. Therefore, the description made above does not contradict the fact that the switching element Tx21 is a one-directional conduction switching element (e.g., insulated gate bipolar transistor). The actual phenomenon will be described below. The operation current I1 flows from the output end Py via the switching element Ty2. Such operation current I1 is subtracted by the amount of the charging current I2 at the connecting point of the DC power supply Ed and the DC power supply line LL, and the current flows in the forward direction through the diode Dx21 and the switching element Tx21. The charging current I2 flows from the DC power supply Ed through the diode Dx21 and the boot capacitor Cbx21. The operation current I1 subtracted by the amount of the charging current I1 and flowed through the switching element Tx21 is added by the amount of the charging current I2 at the connecting point of the switching element Tx21 and the boot capacitor Cbx21 and flowed to the input end Px.

Therefore, the boot capacitor Cbx21 can be charged during the normal operation, so that the electrostatic capacitance required by the boot capacitor Cbx21 can be reduced. Even during the power running, the switching element Tx22 can be conducted at an appropriate timing, at which the converter operation does not become abnormal, to charge the boot capacitor Cbx21.

Similar to the power convertor of FIG. 2, the anode of the diode Dbx21 may be connected to one end on the high potential side of the boot capacitor Cbx11. Alternatively, the anode of the diode Dbx21 may be connected to one end on the high potential side of the boot capacitor Cbx12. In this case, the boot capacitor Cbx21 can be charged using the charges accumulated in the boot capacitor Cbx11 by the conduction of the switching element Tx11. The boot capacitors Cbx12, Cbx21 thus can be charged by the conduction of the switching element Tx11.

From the standpoint of the voltage between both ends of the boot capacitor Cbx21, the anode of the diode Dbx21 is desirably connected to the boot capacitor Cbx22 (alternatively DC power supply Ed). This is because the boot capacitor Cbx21 can be charged with the boot capacitor Cbx22 (or DC power supply Ed) charged with a voltage higher than the voltage between both ends of the boot capacitor Cbx11 as the power supply.

Similar to the second embodiment, a voltage adjustment circuit may be arranged to reduce the variation in voltage of each boot capacitor.

Similar to the fourth embodiment, the serial body of the switching element Tx11 and the diode Dx11 and the serial body of the switching element Tx22 and the diode Dx22 may be respectively realized with one switching element (e.g., reverse blocking insulated gate bipolar transistor). Therefore, the voltage drop by the forward voltage of the diode Dx11, Dx22 in each charging path (serial circuit A8, A9) can be avoided. The voltage between both ends of the boot capacitors Cbx12, Cbx21 thus can be enhanced.

Similar to the fifth embodiment, the diode Dbx12 may not be arranged. The diode Dx11 performs the function of the diode Dbx12.

Similar to the sixth embodiment, the diode Dx21 is desirably arranged on the DC power supply line LL side of the switching element Tx21. More specifically, the diode Dx21 is arranged on the DC power supply line LL side than a point where the switching element Tx21, the drive circuit Drx21, and the boot capacitor Cbx21 are commonly connected. The diode Dx21 thus is not interposed on the charging path (serial circuit A9) of the boot capacitor Cbx21. The boot capacitor Cbx21 can be charged while avoiding the voltage drop by the forward voltage of the diode Dx21.

Figure 15:
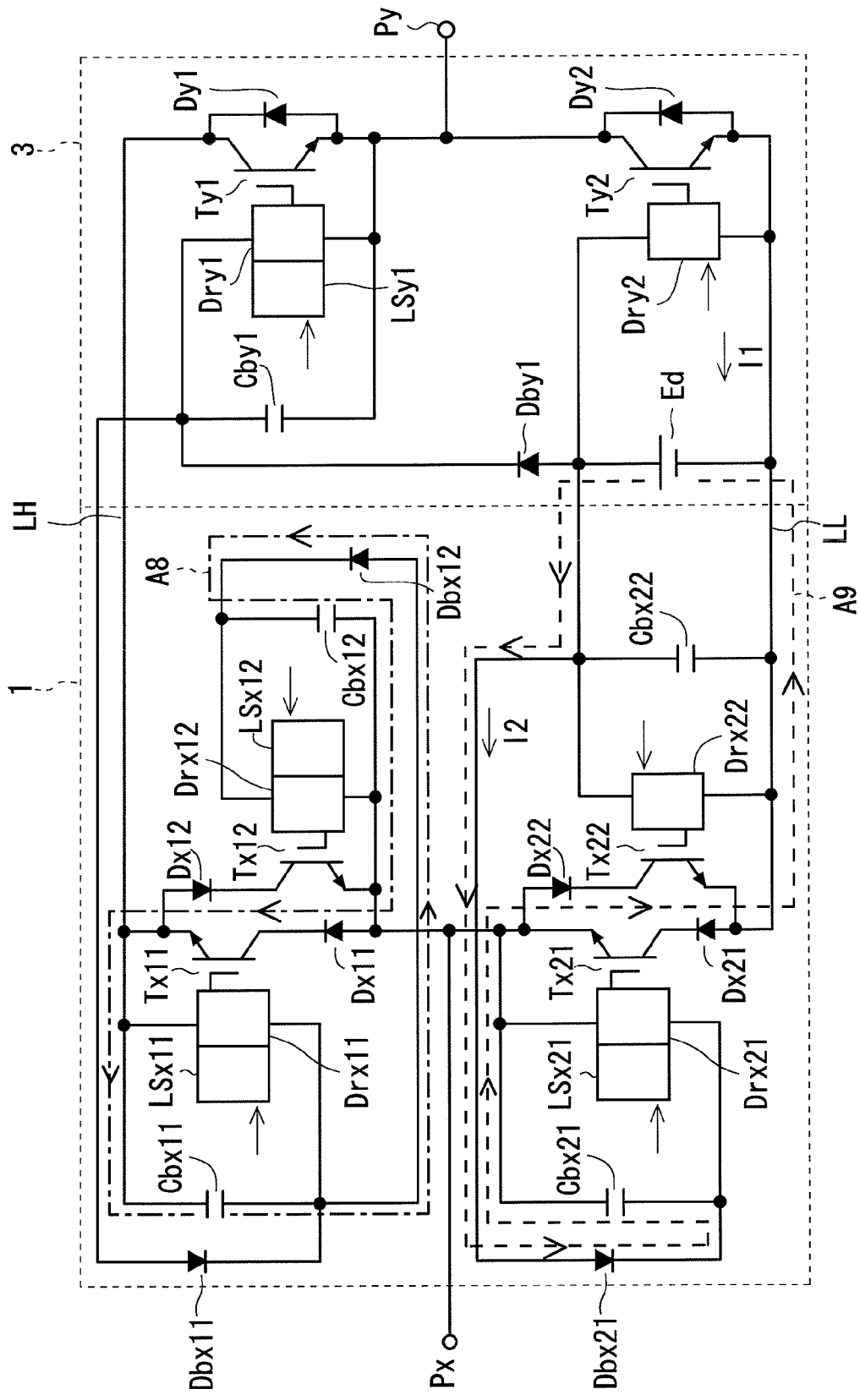

In the circuit configuration shown in FIG. 15, the bi-directional switching element can be configured with the collector electrode of the switching element Tx21 and the collector electrode of the switching element Tx22 connected to each other, where similar effects can be obtained in this case as well.

The second to sixth embodiments are also applicable to other modes described below.

The power converter shown in FIG. 16 differs from the power converter shown in FIG. 15 in the connecting destination of the anode of the diode Dbx12. The anode of the diode Dx12 is connected to one end on the high potential side of the boot capacitor Cbx22. In the illustration of FIG. 16, the boot capacitor Cbx22 and the DC power supply Ed are connected in parallel, and hence the anode of the diode Dx12 can also be understood as being connected to one end on the high potential side of the DC power supply Ed.

According to such configuration, not only the boot capacitor Cbx21, but also the boot capacitor Cbx12 can be charged by conducting the switching element Tx22. The period required for charging thus can be reduced. This is because the current flows to a serial circuit A10 including the boot capacitor Cbx22 (or DC power supply Ed), the diodes Dbx12, Dx22, and the switching element Tx22, and the serial circuit A9 according to such conduction. Furthermore, the boot capacitor Cbx12 is charged with the boot capacitor Cbx22 charged with a voltage higher than that of the boot capacitor Cbx11 as the power supply. The voltage between both ends of the boot capacitor Cbx12 thus can be enhanced.

The power converter shown in FIG. 17 differs from the power converter shown in FIG. 14 in the configuration of the bi-directional switching element. In the power converters of FIGS. 14 and 17, the configuring elements of the switching legs of the r phase, the s phase, and the t phase are the same, but the connecting relationship thereof is different.

The switching elements Tx11, Tx12 (x represents r, s, t) are connected in series to each other between the DC power supply line LH and the input end Px. The emitter electrodes of the switching elements Tx11, Tx12 are connected to each other. The anode of the diode Dx11 is connected to the emitter electrode of the switching element Tx11, and the cathode is connected to the collector electrode of the switching element Tx12. The anode of the diode Dx21 is connected to the emitter electrode of the switching element Tx21, and the cathode is connected to the collector electrode of the switching element Tx11.

The switching elements Tx21, Tx22 are connected in series to each other between the DC power supply line LL and the input end Px. The emitter electrodes of the switching elements Tx21, Tx22 are connected to each other. The anode of the diode Dx21 is connected to the emitter electrode of the switching element Tx21, and the cathode is connected to the collector electrode of the switching element Tx22. The anode of the diode Dx22 is connected to the emitter electrode of the switching element Tx22, and the cathode is connected to the collector electrode of the switching element Tx21.

Figure 18:
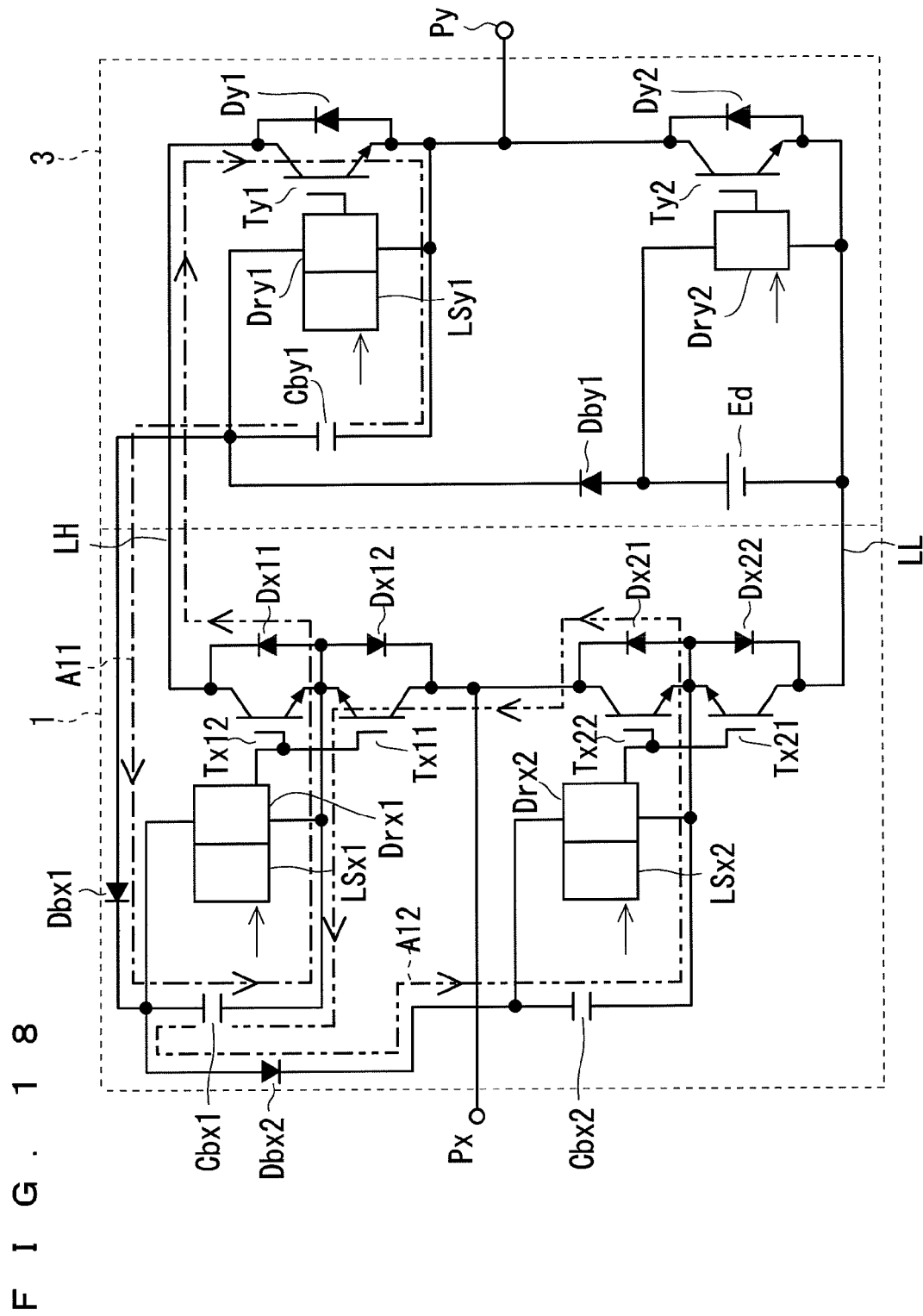

According to the converter 1, the emitter electrodes of the switching elements Tx11, Tx12 are connected to each other, and the emitter electrodes of the switching elements Tx21, Tx22 are connected to each other. Therefore, as shown in FIG. 18, the operation power supplies of the switching elements Tx11, Tx12 can be made common, and the operation power supplies of the switching elements Tx21, Tx22 can be made common. This will be more specifically described below.

The switching elements Tx11, Tx12 are driven by the drive circuit Drx1. The drive circuit Drx1 is commonly connected to the gate electrodes of the switching elements Tx11, Tx12. The level shift circuit LSx1 is connected to the drive circuit Drx1.

A voltage between both ends of a boot capacitor Cbx1 is supplied to the drive circuit Drx1 as the operation power supply. One end of the boot capacitor Cbx1 is connected to the emitter electrodes of the switching elements Tx11, Tx12, and the drive circuit Drx1. The other end of the boot capacitor Cbx1 is connected to the drive circuit Drx1.

The other end of the boot capacitor Cbx1 is connected to one end on the high potential side of the boot capacitor Cby1 by way of the diode Dbx1. The diode Dbx1 is arranged with the cathode directed towards the boot capacitor Cbx1. The diode Dbx1 prevents the boot capacitor Cbx1 from discharging towards the boot capacitor Cby1.

According to such configuration, the boot capacitor Cbx1 can be charged using the charges accumulated in the boot capacitor Cby1 by conducting the switching element Ty1. This is because the current flows to a serial circuit A11 including the boot capacitor Cby1, the diode Dbx1, the boot capacitor Cbx1, the diode Dx11, and the switching element Ty1 by such conduction.

Therefore, the operation power supplies of the switching elements Tx11, Tx12 can be made common, and the boot capacitor Cbx1 is adopted for such operation power supply, so that the number of DC power supplies can be reduced.

The diode Dx11 prevents the boot capacitor Cbx1 from discharging in the serial circuit A11, where the diode Dbx1 is desirably arranged in the present power converter. This is because the diode Dx11 prevents the boot capacitor Cbx1 from discharging towards the boot capacitor Cby1 through a path not passing the diode Dx11 in the normal operation, similar to the fifth embodiment.

The operation power supplies of the switching elements Tx21, Tx22 will now be described. The switching elements Tx21, Tx22 are driven by the drive circuit Drx2. The drive circuit Drx2 is commonly connected to the gate electrodes of the switching elements Tx21, Tx22. The level shift circuit LSx2 is connected to the drive circuit Drx2.

The voltage between both ends of the boot capacitor Cbx2 is supplied to the drive circuit Drx2 as the operation power supply. One end of the boot capacitor Cbx2 is connected to the emitter electrodes of the switching elements Tx21, Tx22, and the drive circuit Drx2. The other end of the boot capacitor Cbx2 is connected to the drive circuit Drx2.

The other end of the boot capacitor Cbx2 is connected to one end on the high potential side of the boot capacitor Cbx1 by way of the diode Dbx2. The diode Dbx2 is arranged with the cathode directed towards the boot capacitor Cbx2. The diode Dbx2 prevents the boot capacitor Cbx2 from discharging towards the boot capacitor Cbx1.

According to such configuration, the boot capacitor Cbx2 can be charged using the charges accumulated in the boot capacitor Cbx1 by conducting the switching elements Tx11, Ty1. This is because the current flows to a serial circuit A12 including the boot capacitor Cbx1, the diode Dbx2, the boot capacitor Cbx2, the diode Dx21, and the switching element Tx11 by such conduction.

Therefore, the operation power supplies of the switching elements Tx21, Tx22 can be made common, and the boot capacitor Cbx2 is adopted for such operation power supply, so that the number of DC power supplies can be reduced.

In the normal operation of the power converter of FIG. 18, the switching element Tx12 is conducted when regenerating the energy from the inverter 3 towards the power supply. In this case, the current (hereinafter referred to as charging current) flows from the boot capacitor Cby1 to the boot capacitor Cbx1 via the diode Dbx1 through the switching element Tx12 instead of the diode Dx11 if the switching element Ty1 is conducted. A relatively large regenerative current from the inverter 3 flows in the forward direction to the switching element Tx12, and a relatively small boot charging current flows in the reverse direction. As a result, the current in the forward direction flows to the switching element Tx12. Such description is similar to the charging of the boot capacitor Cbx21 via the switching element Tx21 and the diode Dx21 during the power running with reference to FIG. 15. In other words, the description does not contradict the fact that the switching element Tx12 is a one-directional conduction switching element.

The voltage Vcbx1_t between both ends of the boot capacitor Cbx1 can be expressed with the following equation, where Vcby1 is the voltage between both ends of the boot capacitor Cby1, Vf1 is the forward voltage of the diode Dbx1, Vce1 is the voltage between the collector electrode and the emitter electrode of the switching element Tx11, and Vce is the voltage between the collector electrode and the emitter electrode of the switching element Ty1.

$$Vcbx1\_t = Vcby1 - Vf1 + Vce1 - Vce \quad (7)$$

In the charging operation prior to the normal operation, the current flows to the serial circuit A10 to charge the boot capacitor Cbx1, as described above. The voltage Vcbx1_d between both ends of the boot capacitor Cbx1 can be expressed with the following equation, where Vf2 is the forward voltage of the diode Dx11.

$$Vcbx1\_d = Vcby1 - Vf1 - Vf2 - Vice \quad (8)$$

In the normal operation, the switching element Tx11 is not conducted if at the time of powering, and hence the current flows to the serial circuit A10 to charge the boot capacitor Cbx1, similar to the charging operation prior to the normal operation.

The diode Dy1, instead of the switching element Ty1, is sometimes conducted at the time of the regeneration, but in such a case, equation (7) and equation (8) result in values subtracted by (Vice+Vf).

Therefore, the voltage between both ends of the boot capacitor Cbx1 differ by the distinction of during regeneration and during power running. Therefore, if the voltage adjustment circuit is arranged as in the second embodiment with respect to the power converter of FIG. 18, a standpoint of whether to base the designing of the voltage adjustment circuit on equation (7) or equation (8) arises. In conclusion, the voltage adjustment circuit may be based on either equation (7) or equation (8). At least the variation in each boot capacitor can be reduced. A weighting coefficient may be multiplied on the voltage Vcbx1_t, Vcbx1_d between both ends, and a value added with such resultant value may be grasped as the voltage between both ends of the boot capacitor Cbx1. The weighting coefficient is, for example, a positive value, and the sum is one. The weighting coefficient for the voltage Vcbx1_t between both ends may be increased if the period during regeneration is relatively large in view of the operation status of the load 4.

The voltage clamp circuit may be connected in parallel to the boot capacitor Cbx1 so that the voltages Vcbx1_t, Vcbx1_d between both ends are both higher than the clamp voltage, whereby the voltage clamp circuit can supply a stable voltage to the drive circuit Dr2.

Ninth Embodiment

Figure 19:
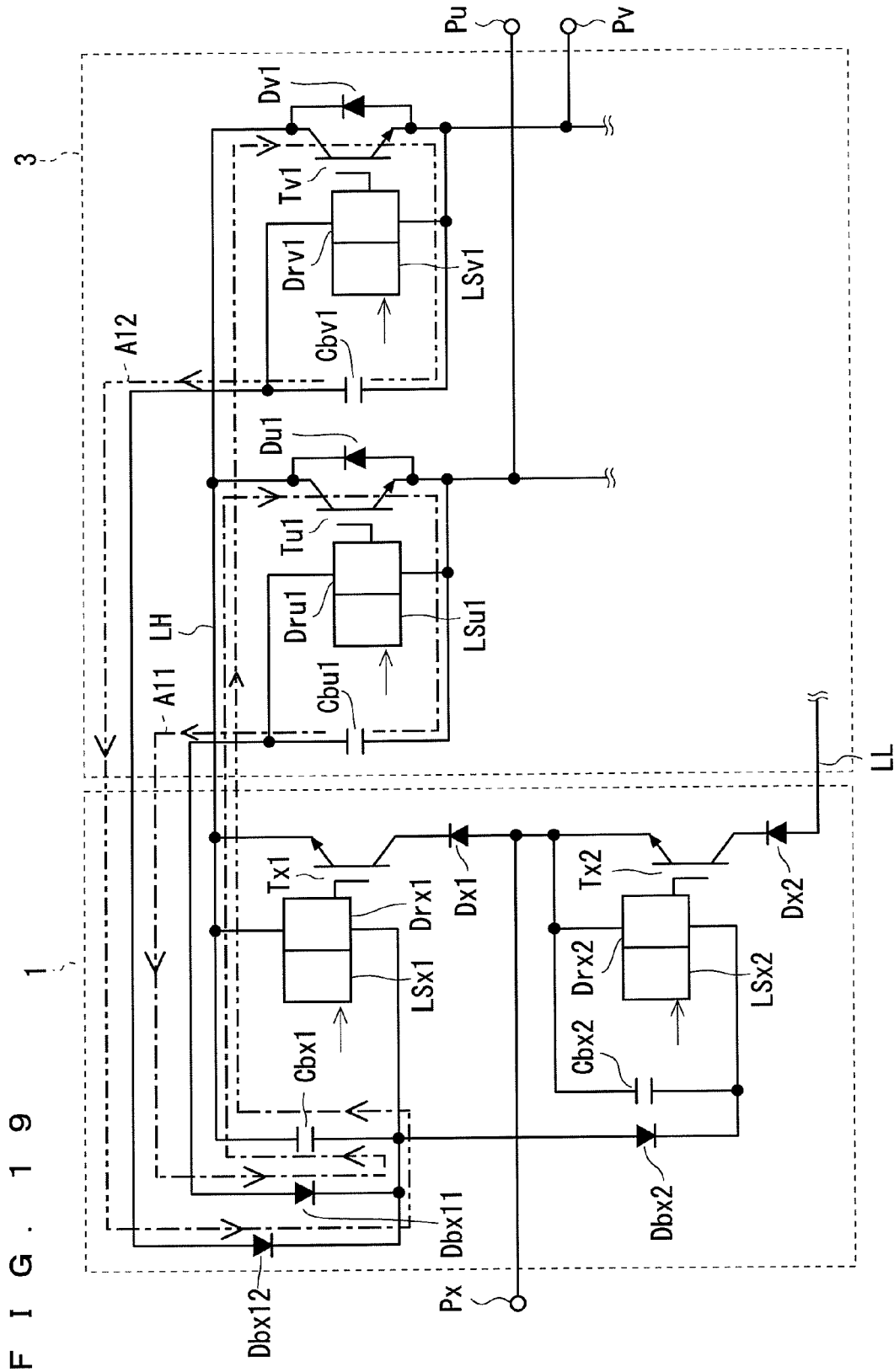

A power converter shown in FIG. 19 differs from the power converter shown in FIG. 2 in the connecting destination of the boot capacitor Cbx1. In FIG. 19, one switching leg of the converter 1 is shown, and two switching legs (only switching element on upper side) of the inverter 3 are shown.

In the illustration of FIG. 19, one end on the high potential side of the boot capacitor Cbx1 is connected to one end on the high potential side of boot capacitors Cbu1, Cbv1, respectively, by way of the diodes Dbx11, Dbx12. The diodes Dbx11, Dbx12 are respectively arranged with the cathode directed towards the boot capacitor Cbx1. The diodes Dbx11, Dbx12 respectively prevents the boot capacitor Cbx1 from discharging towards the boot capacitor Cbu1, Cbv1.

According to such power converter, the boot capacitor Cbx1 can be charged using the charges accumulated in the boot capacitor Cbu1 by the conduction of the switching element Tu1. This is because the current flows to the serial circuit A11 including the boot capacitor Cbu1, the diode Dbx11, the boot capacitor Cbx1, and the switching element Tu1 by the conduction of the switching element Tu1. The boot capacitor Cbx1 can also be charged using the charges accumulated in the boot capacitor Cby1 by the conduction of the switching element Tv1. This is because the current flows to the serial circuit A12 including the boot capacitor Cbv1, the diode Dbx12, the boot capacitor Cbx1, and the switching element Tv1 by the conduction of the switching element Tv1.

Therefore, the boot capacitor Cbx1 can be charged by conducting at least one of the switching elements Tu1, Tv1. The opportunity the boot capacitor Cbx1 can be charged in the normal operation thus increases. In other words, the influence of the conduction/non-conduction state of the switching elements Tu1, Tv1 is averaged, so that the voltage between both ends of the boot capacitor Cbx1 can be stabilized.

In the illustration of FIG. 19, the boot capacitor Cbx1 is connected to the boot capacitors Cbu1, Cbv1 by way of the diode, but is not limited thereto, and may be connected to the boot capacitors Cbu1, Cbv1, Cbw1 by way of the diodes.

A mode in which the operation power supplies for the switching elements Tr1, Ts1, Tt1 are respectively supplied by different boot capacitors Cbr1, Cbs1, Cbt1 will now be considered. In this case, the boot capacitor Cbr1 may be connected to the boot capacitors Cbu1, Cbv1, Cbw1 by way of the diode. The boot capacitors Cbr1, Cbs1, Cbt1 thus can be charged by the conduction of any switching element Tut, Tv1, Tw1. This is similar with respect to the boot capacitors Cbs1, Cbt1. Thus, the fluctuation in the voltage between both ends of the boot capacitor Cbx1 due to bias in the state of conduction/non-conduction of each switching element Ty1 can be reduced.

The technique according to the ninth embodiment can be applied to any one of the power converters according to the first to eighth embodiments.

Any boot capacitor (e.g., boot capacitors Cbx1, Cbx2, Cb1, Cbx) described above merely need to be able to accumulate charges as the operation power supply of the switching element, and hence are not limited to the form of capacitor.

Any switching element does not need to be limited to the insulated gate bipolar transistor, and for example, may be an element having a different structure such as a bipolar transistor or a field effect transistor. For instance, in the case of the field effect transistor, the first electrode corresponds to the source electrode, and the second electrode corresponds to the drain electrode.

A resistor, or the like may be inserted to the charging path of any boot capacitor to limit the current during charging.

The present invention has been described in detail above, but the description is merely illustrative in all aspects and should not be construed as limiting the present invention. It should be recognized that an infinite number of variants that are not described herein can be contrived without deviating from the scope of the present invention.

DESCRIPTION OF SYMBOLS

Cbx1, Cbx2, Cby1: boot capacitor
Dbx1, Dbx2, Dby1, Dx1: diode
Ed: DC power supply
LH, LL: DC power supply line
Pr, Ps, Pt: input end
Pu, Pv, Pw: output end
VAx1, VAx2, VAy1: voltage adjustment unit

The invention claimed is:

1. A power converter comprising:
    a first power supply line;
    a second power supply line applied with a potential lower than said first power supply line;
    an output end;
    a power converting section including a first switching element arranged between said output end and said first power supply line, and a power supply section having both ends between which a DC voltage is supported, one end on a low potential side of said ends being connected to said first switching element on said second power supply line side and serving as an operation power supply for outputting a switch signal to said first switching element;
    a second switching element arranged between said first and second power supply lines;
    a boot capacitor including one end connected to the second switching element on said first power supply line side and another end electrically connected to the other end of said power supply section, and serving as an operation power supply for outputting a switch signal to said second switching element when charged; and
    a diode, arranged between the other end of said power supply section and said first power supply line through said boot capacitor, for flowing current only in a direction from said power supply section towards said boot capacitor.

2. The power converter according to claim 1, further comprising
    a third switching element connected in series with said second switching element on said second power supply line side between said first and second power supply lines;
    a second boot capacitor including one end connected to said third switching element on said first power supply line side and another end, and serving as an operation power supply for outputting a switch signal to said third switching element when charged; and
    a second diode arranged with a cathode directed towards said second boot capacitor between said other end of said boot capacitor or said other end of the power supply section and said other end of said second boot capacitor.

3. The power converter according to claim 2, wherein said second switching element has a reverse blocking structure.

4. The power converter according to claim 1, wherein said second switching element has a reverse blocking structure.

5. The power converter according to claim 1, further comprising
    a second diode connected in series with said second switching element on said second power supply line side and arranged with an anode directed towards said second power supply line;
    a third switching element connected in series on said second power supply line side with respect to a serial body of said second switching element and said second diode;
    a third diode connected in series with said third switching element on said second power supply line side with respect to said serial body; and
    a second boot capacitor including one end connected to said third switching element on said first power supply line side and another end connected to said other end of said boot capacitor and serving as an operation power supply for outputting a switch signal to said third switching element when charged.

6. The power converter according to claim 5, wherein said third diode is positioned on said second power supply line side with respect to said third switching element.

7. The power converter according to claim 1, wherein said diode is arranged between said second switching element and said first power supply line.

8. The power converter according to claim 1, further comprising
    a second diode arranged between said first power supply line and a connecting point of said second switching element and said boot capacitor, wherein
    said diode is arranged between said power supply section and said connecting point.

9. The power converter according to claim 1, further comprising
    a second diode connected in series with said second switching element and arranged with a cathode directed towards said first power supply line;
    a third switching element;
    a third diode connected in series with said third switching element and arranged with a cathode directed towards said second power supply line, a serial body of said third diode and said third switching element being connected in parallel with a serial body of said second switching element and said second diode;
    a second boot capacitor including one end connected to said third switching element on said second power supply line side and another end connected to said other end of said boot capacitor and serving as an operation power supply for outputting a switch signal to said third switching element when charged; and a fourth diode arranged with a cathode directed towards said second boot capacitor between said boot capacitor and said second boot capacitor.

10. The power converter according to claim 1, further comprising a second diode connected in series with said second switching element and arranged with a cathode directed towards said first power supply line;

a third switching element;

a third diode connected in series with said third switching element and arranged with a cathode directed towards said second power supply line, a serial body of said third diode and said third switching element being connected in parallel with a serial body of said second switching element and said second diode;

a bidirectional switching element connected in series with said serial body on said second power supply line side;

a fourth switching element arranged between said output end and said second power supply line;

a second power supply section having one end connected to said fourth switching element on said second power supply line side and serving as an operation power supply for outputting a switch signal to said fourth switching element;

a second boot capacitor including one end connected to said third switching element on said second power supply line side and another end connected to another end of said second power supply section and being an operation power supply for outputting a switch signal to said third switching element when charged; and a fourth diode arranged with a cathode directed towards said second boot capacitor between said second boot capacitor and said second power supply section.

11. The power converter according to claim 1, further comprising a third switching element connecting to said second switching element on said first power supply line side;

a second diode connected in parallel to said third switching element with a cathode directed towards said first power supply line; and a third diode connected in parallel with said second switching element with a cathode directed towards said second power supply line, wherein said boot capacitor is commonly connected to a connecting point of said second switching element and said third switching element, and functions as an operation power supply for outputting a switch signal to said second switching element and said third switching element.

12. The power converter according to claim 1, wherein
said second switching element is arranged in plurals, all of said second switching elements are directly connected to said first power supply line, and said boot capacitor functions as an operation power supply for outputting a switch signal to two or more second switching elements of said plurality of second switching elements.

13. The power converter according to claim 1, wherein
said power converting section further includes a voltage adjustment unit for lowering voltage of said voltage supplying section to function as an operation power supply of said first switching element.

14. The power converter according to claim 1, wherein
said first switching element and said power supply section are arranged in plurals, one end of said plurality of power supply sections respectively being connected to said plurality of first switching elements on said second power supply line side;

said diode is arranged between other end of one of said plurality of power supply sections and other end of said boot capacitor; and a boot diode arranged with a cathode directed towards said boot capacitor between other end of another one of said plurality of power supply sections and other end of said boot capacitor is further arranged.

15. The power converter according to claim 1, wherein
said first switching elements and said power supply section are arranged in plurals, one end of said plurality of power supply sections being connected to said plurality of first switching elements on said second power supply line side, and said diode is arranged between said second switching element and said first power supply line.

16. The power converter according to claim 1, wherein
said power supply section is a third boot capacitor, and
a fourth switching element arranged between said output end and said second power supply line;

a DC power supply having one end connected to the fourth switching element on said second power supply line side and another end, and serving as an operation power supply for outputting a switch signal to said fourth switching element; and a diode arranged with an anode directed towards said DC power supply and a cathode directed towards said boot capacitor between said other end of said boot capacitor and said other end of said DC power supply are further arranged.

* * * * *